(12) United States Patent
Zhu et al.

(10) Patent No.: US 11,446,918 B2
(45) Date of Patent: Sep. 20, 2022

(54) NONPLANAR PATTERNED NANOSTRUCTURED SURFACE AND PRINTING METHODS FOR MAKING THEREOF

(71) Applicant: 3M INNOVATIVE PROPERTIES COMPANY, St. Paul, MN (US)

(72) Inventors: James Zhu, Woodbury, MN (US); Karl K. Stensvad, Inver Grove Heights, MN (US); Daniel M. Lentz, Cottage Grove, MN (US); Thomas J. Metzler, St. Paul, MN (US); Moses M. David, Wells, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 166 days.

(21) Appl. No.: 15/733,300

(22) PCT Filed: Dec. 26, 2018

(86) PCT No.: PCT/IB2018/060624
§ 371 (c)(1),
(2) Date: Jun. 22, 2020

(87) PCT Pub. No.: WO2019/130221
PCT Pub. Date: Jul. 4, 2019

(65) Prior Publication Data
US 2021/0094272 A1    Apr. 1, 2021

Related U.S. Application Data

(60) Provisional application No. 62/612,219, filed on Dec. 29, 2017.

(51) Int. Cl.
*B41C 1/00* (2006.01)
*B41C 1/18* (2006.01)
(Continued)

(52) U.S. Cl.
CPC .............. *B41C 1/003* (2013.01); *B41C 1/184* (2013.01); *B41K 3/26* (2013.01); *B81C 1/00206* (2013.01); *B81C 2201/0185* (2013.01)

(58) Field of Classification Search
CPC . B41C 1/003; B41C 1/184; B81C 2201/0185; B41K 3/26
See application file for complete search history.

(56) References Cited

U.S. PATENT DOCUMENTS

| 5,900,160 A | 5/1999 | Whitesides et al. |
| 6,518,168 B1 | 2/2003 | Clem et al. |

(Continued)

FOREIGN PATENT DOCUMENTS

| EP | 0 812 434 B1 | 9/2013 |
| WO | WO 2013003253 | 1/2013 |
| WO | WO 2013040319 | 3/2013 |

OTHER PUBLICATIONS

Aldrich, "Molecular Self-Assembly", 2006, vol. 1, No. 2, 20 pages.
(Continued)

*Primary Examiner* — Daniel J Colilla
(74) *Attorney, Agent, or Firm* — Thomas M. Spielbauer

(57) ABSTRACT

A method of applying a pattern to a nonplanar surface. A stamp has a major surface with pattern elements having a lateral dimension of greater than 0 and less than about 5 microns. The major surface of the stamp has a functionalizing molecule with a functional group selected to chemically bind to the nonplanar surface. The stamp is positioned to initiate rolling contact with the nonplanar surface, and contacts the nonplanar surface to form a self-assembled monolayer (SAM) of the functionalizing material thereon and impart the arrangement of pattern elements thereto. The major surface of the stamp is translated with respect to the nonplanar surface such that: a contact pressure is controlled at an interface between the stamping surfaces and the
(Continued)

nonplanar surface, and a contact force at the interface is allowed to vary while the stamping surfaces and the nonplanar surface are in contact with each other.

14 Claims, 12 Drawing Sheets

(51) Int. Cl.
*B41K 3/26* (2006.01)
*B81C 1/00* (2006.01)

(56) References Cited

U.S. PATENT DOCUMENTS

| | | |
|---|---|---|
| 2010/0018421 A1 | 1/2010 | Pan |
| 2010/0258968 A1 | 10/2010 | Zu |
| 2011/0244116 A1* | 10/2011 | Badre .................. B82Y 30/00 977/773 |
| 2012/0247355 A1* | 10/2012 | Berniard .................. C23F 1/14 101/483 |
| 2015/0101745 A1* | 4/2015 | Ramakrishnan ..... H05K 3/1275 156/60 |
| 2015/0336379 A1 | 11/2015 | Rattray et al. |

OTHER PUBLICATIONS

Boeckl and D. Graham, Self-assembled monolayers: Advantages of pure alkanethiols.
Hong, "ALD resist formed by vapor-deposited self-assembled monolayers", Langmuir, 2007, vol. 23, pp. 1160-1165.
Libioulle, "Contact-Inking Stamps for Microcontact Printing of Alkanethiols on Gold,", 1999, Langmuir, vol. 15, pp. 300-304.
Love, "Self-Assembled Monolayers of Thiolates on Metals as a Form of Nanotechnology," Chemical Reviews, 2005, vol. 105, pp. 1103-1169.
Ruiz, "Microcontact printing: A tool to pattern", Soft Matter, 2007, vol. 3, pp. 168-177.
Ulman, "Formation and Structure of Self-Assembled Monolayers," Chemical Reviews. 1996, vol. 96, pp. 1533-1554.
Ulman, "Self-assembled monolayers of alkyltrichlorosilanes: Building blocks for future organic materials", Advanced Materials, Advance Materials, 1990, vol. 2, No. 12, pp. 573-582.
International Search report for PCT International Application No. PCT/IB2018/060624 dated Apr. 10, 2019, 5 pages.

* cited by examiner

NONPLANAR PATTERNED NANOSTRUCTURED SURFACE AND PRINTING METHODS FOR MAKING THEREOF

CROSS REFERENCE TO RELATED APPLICATIONS

This application is a national stage filing under 35 U.S.C. 371 of PCT/IB2018/060624, filed Dec. 26, 2018, which claims the benefit of U.S. Application No. 62/612,219, filed Dec. 29, 2017, the disclosure of which is incorporated by reference in its/their entirety herein.

BACKGROUND

Cylindrical tool rolls are useful in diverse industrial operations, especially in roll-to-roll manufacturing. Microstructured cylindrical tool rolls including structured patterns with length scales on the order of single micron and above can be made with diamond turning machines, which use a diamond tipped tool to cut copper on a precision lathe. However, this method is fundamentally a turning operation, which limits the size of the structures and the pattern geometry that can be reproducibly cut into a nonplanar substrate like the surface of a cylindrical tool roll.

To make nanosized (greater than about 100 nm and less than about 1 micron) features and patterns on a nonplanar surface, lithography and laser ablation can be used, but these techniques produce excessively large features, offer limited options for pattern geometry, or require unacceptably long patterning times.

Microcontact printing can be used to transfer a two-dimensional nanoscale pattern of structures to a nonplanar substrate at a relatively low cost. Microcontact printing transfers to the substrate a pattern of functionalizing molecules, which include a functional group that attaches to the substrate surface or a coated substrate surface via a chemical bond to form a patterned self-assembled monolayer (SAM). The SAM is a single layer of molecules attached by a chemical bond to a surface and that have adopted a preferred orientation with respect to that surface and even with respect to each other.

A basic method for microcontact printing SAMs includes applying an ink containing the functionalizing molecules to a relief-patterned elastomeric stamp (for example, a poly(dimethylsiloxane) (PDMS) stamp) and then contacting the inked stamp with a substrate surface, usually a metal or metal oxide surface, so that SAMs form in the regions of contact between the stamp and the substrate. The metallic surface may then be further processed to remove metal that is not protected by the SAM to form a two-dimensional nanoscale pattern on the manufacturing tool.

The functionalizing molecules should be reproducibly transferred from the elastomeric stamp to the metal substrate surface in the desired high-resolution patterned SAM with a minimum number of defects. Pattern defects such as line blurring and voids should be minimized to ensure accurate SAM pattern resolution and reproducibility.

SUMMARY

In general, the present disclosure is directed to a process for printing a microstructured or a nanostructured pattern on at least a portion of a tool having a nonplanar surface, such as a cylindrical roll suitable for use in a roll-to-roll manufacturing processes. The pattern on the tool acts as an etch mask for subsequent processing steps to transfer the printed nanostructured pattern into the nonplanar metal surface of the tool. The size of the relief-patterned stamp used in the printing process may vary greatly in size, and in some embodiments a stamp is tiled on the nonplanar print layer in a step and repeat process to create many individual prints that can be stitched together to cover a selected region of the tool surface.

In various embodiments of the printing process of the present disclosure, the contact pressure between the printing surface of the relief-patterned stamp and the nonplanar surface of the tool is controlled and the contact force between the printing surface and the nonplanar surface of the tool is allowed to vary.

In one aspect, the present disclosure is directed to a method of applying a pattern to a nonplanar surface, wherein at least a portion of the nonplanar surface has a radius of curvature.

The method includes providing a stamp with a major surface having a relief pattern of pattern elements extending away from a base surface, and wherein each pattern element has a stamping surface with a lateral dimension of greater than 0 and less than about 5 microns; applying an ink on the stamping surface, the ink including a functionalizing molecule with a functional group selected to chemically bind to the nonplanar surface; positioning the stamp to initiate rolling contact between the nonplanar surface and the major surface of the stamp; contacting the stamping surface of the pattern elements with the nonplanar surface to form a self-assembled monolayer (SAM) of the functionalizing material on the nonplanar surface and impart the arrangement of pattern elements thereto; and translating the major surface of the stamp with respect to the nonplanar surface, wherein translating the major surface of the stamp includes: (1) controlling a contact pressure at an interface between the stamping surfaces and the nonplanar surface, and (2) allowing the contact force at the interface to vary while the stamping surfaces and the nonplanar surface are in contact with each other.

In another aspect, the present disclosure is directed to an apparatus for applying a pattern to a nonplanar surface having a least one portion with a radius of curvature. The apparatus includes a stamper with an elastomeric stamp having a first major surface, wherein the first major surface of the stamp has a relief pattern of pattern elements extending away from a base surface, and wherein each pattern element has a stamping surface with a lateral dimension of greater than 0 and less than about 5 microns, an ink absorbed into the stamping surfaces of the stamp, the ink having a functionalizing molecule with a functional group selected to chemically bind to the nonplanar surface; a first motion controller supporting the stamper and adapted to move the stamp with respect to the nonplanar surface; a second motion controller adapted to move the nonplanar surface; and a force controller to control force at an interface between the stamping surfaces on the stamp and the nonplanar surface; wherein the first and the second motion controllers move the stamp and the nonplanar surface in relative motion such that the stamping surfaces contact the nonplanar surface to impart the arrangement of pattern elements thereto, and wherein the relative motion between the stamp and the nonplanar surface is mediated by the force controller to: (1) control a contact pressure at an interface between the stamping surfaces and the nonplanar surface, and (2) allow the contact force at the interface to vary while the stamping surfaces and the nonplanar surface are in contact with each other.

In another aspect, the present disclosure is directed to a method of applying a pattern to an exterior surface of a roller. The method includes absorbing an ink into a major surface of a stamp, the ink having a functionalizing molecule with a functional group selected to chemically bind to the exterior surface of the roller, wherein the major surface of the stamp has a relief pattern of pattern elements extending away from a base surface, and wherein each pattern element includes a stamping surface with a lateral dimension of greater than 0 and less than about 5 microns; contacting the stamping surface of the pattern elements with the surface of the roller to bind the functional group with the surface of the roller to form a self-assembled monolayer (SAM) of the functionalizing material on the surface of the roller and impart the arrangement of pattern elements thereto; translating the major surface of the stamp with respect to the surface of the roller, wherein translating the major surface of the stamp includes: (1) controlling a contact pressure at an interface between the patterning surfaces and the surface of the roller, and (2) allowing the contact force at the interface to vary while the patterning surfaces and the surface of the roller are in contact with each other; and repositioning the stamp a plurality of times in a step and repeat fashion to transfer the arrangement of pattern elements to a plurality of different portions of the surface of the roller and form an array of pattern elements, wherein a stitch error between adjacent pattern elements in the array is less than about 10 μm.

In another aspect, the present disclosure is directed to a method of making a tool, the method including: providing a cylindrical roller including a metal substrate, a tooling layer on the metal substrate, and an external metal print layer on the tooling layer; imparting an arrangement of pattern elements on the metal print layer, wherein each pattern element has a lateral dimension of greater than 0 and less than about 5 microns; and translating the major surface of the stamp with respect to the metal print layer, wherein translating the major surface of the stamp includes: (1) controlling a contact pressure at an interface between the patterning surfaces and the print layer, and (2) allowing the contact force at the interface to vary while the patterning surfaces and the print layer are in contact with each other; imparting the pattern elements a plurality of times in a step and repeat fashion to transfer the arrangement of pattern elements to a plurality of different portions of the print layer and form an array of pattern elements thereon, wherein a stitch error between adjacent pattern elements in the array is less than about 10 μm; and etching away portions of the metal print layer uncovered by the pattern elements, exposing portions of the tooling layer.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements.

DETAILED DESCRIPTION

Figure 1A:
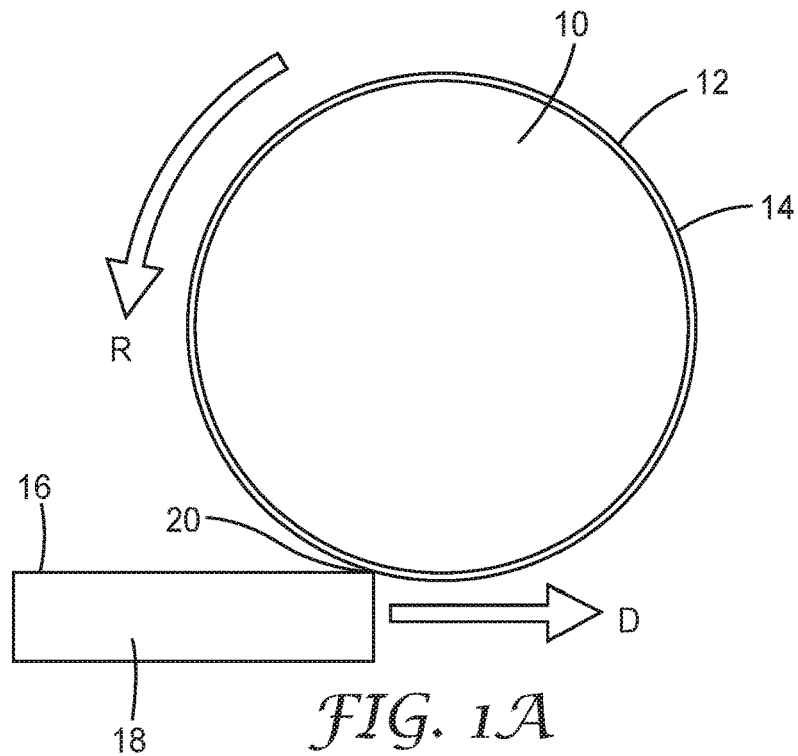
FIGS. 1A-1B are schematic side views of a microcontact printing process in which a cylindrical roller with a nonplanar metallic surface makes rolling contact with an elastomeric stamp inked with a SAM forming molecular species, and the SAM forming molecular species are transferred from a stamping surface of the stamp to the nonplanar metallic surface to form a nanoscale pattern thereon.

Referring to FIG. 1A, a cylindrical roll 10 has a nonplanar surface 12, which is on a thin metal layer 14. A stamping surface 16 of a stamp 18 contains a SAM forming molecular species (not shown in FIG. 1A) that is to be applied to the nonplanar surface 12 to form a corresponding pattern thereon. In FIG. 1A, the nonplanar metallic surface 12 is about to be patterned by rolling contact with the stamping surface 16 of the stamp 18. To achieve the rolling contact, the roll 10 is rotated in direction "R" while stamp 18 is translated in direction "D" along a trajectory to initiate printing contact between the stamping surface 16 and the nonplanar metallic surface 12 at an initial point of contact 20. The speed of rotation in direction "R" is such that the tangential surface speed of metallic nonplanar surface 12 substantially equals (±5%) the speed of motion in direction "D" to minimize or eliminate slippage at the initial point of contact 20. The stamping surface 16 and the nonplanar metallic surface 12 remain in substantially steady-state contact such that only a portion of each surface is in contact with only a portion of the other surface at any given time, but the portion of each surface that is in contact with the portion of the other surface changes continuously.

Figure 1B:
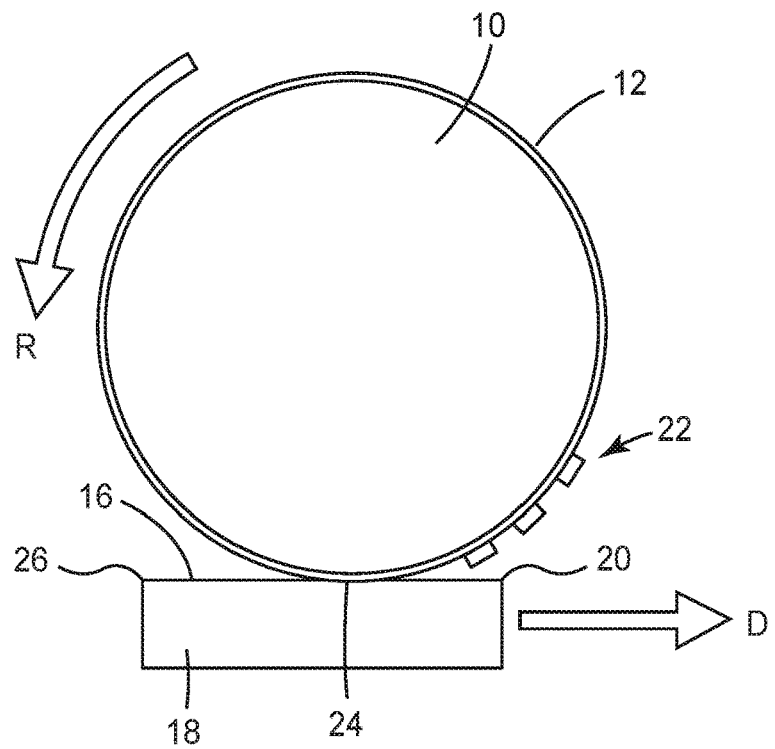

Referring to FIG. 1B, the cylindrical roll 10 rolls over the stamping surface 16 to maintain substantially constant force between the stamping surface 16 and the nonplanar metallic surface 12, and the pattern of SAM forming molecular species 22 is applied on the nonplanar metallic surface 12. As the stamp 18, which in some embodiments is made of an elastomeric material, moves in rolling contact relative to the nonplanar metallic surface 12 to form the pattern 22, the contact area between the stamping surface 16 and the nonplanar metallic surface 12 continuously changes, resulting in changes in contact pressure. For example, the stamp 18 is compressed at the initial point of contact 20, and the contact interface 24 between the stamp 18 and the nonplanar metallic surface 12 gradually increases as rolling progresses to some approximately steady contact area. As contact interface 24 approaches the terminal point of contact 26 of the stamp 18, the contact area is reduced to an infinitesimally narrow line.

The present disclosure relates to apparatus and methods for controlling initiation, engagement, and disengagement of the stamp 18 from the nonplanar surface 12 during the microcontact printing process to reproducibly form nano-sized features in a pattern 22 on the nonplanar surface 12 in patterns with high resolution. In various embodiments, the apparatus and methods of the present disclosure include at least one of: (1) controlling the contact force between the stamp 18 and the cylindrical roll 10, and (2) controlling the pressure between the stamp 18 and the cylindrical roll 10.

In various embodiments, after the position of the initial contact point 20 between the stamping surface 16 and the nonplanar metallic surface 12 is determined, the stamp 18 and the cylindrical roll 10 are translated with respect to one another such that: (1) a contact force at the interface 24 between the stamping surface 16 on the stamp 18 and the nonplanar surface 12 is allowed to vary, and (2) a contact pressure at the interface 24 is controlled while the stamping surface 16 and the nonplanar surface 12 are in contact with each other.

Figure 2A:
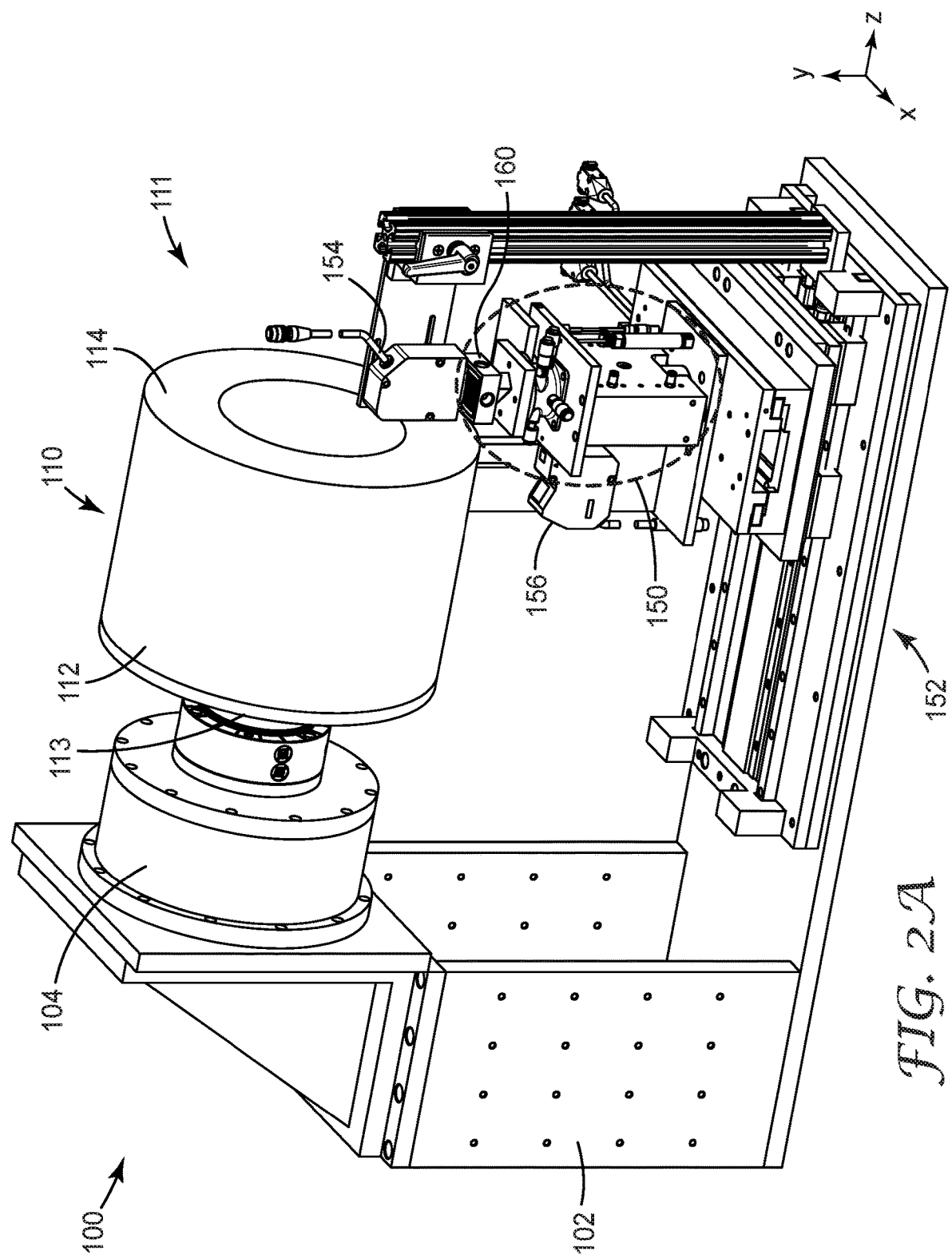
FIG. 2A is a schematic perspective view of an apparatus for microcontact printing (MCP) on a nonplanar substrate according to the present disclosure.

Referring to FIG. 2A, a microcontact printing apparatus 100 includes a rigid roller support 102 having mounted thereon an air bearing spindle 104. A roller 110 mounted to rotate on a rotation shaft 113 of the air bearing spindle 104 includes a nonplanar surface 112 on a metal support roll 114.

The microcontact printing apparatus 100 further includes a stamp module 150 mounted on a stage apparatus 152. Using the stage apparatus 152, the stamp module 150 may be moved in any direction along the x and z axes with respect to the roller 110. The apparatus 100 further includes a confocal distance sensor 154, which can be used to monitor the surface topography of a stamp (not shown in FIG. 2A) mounted on the stamp module 150. Metrology data for a stamp mounted on a surface 160 of the stamping module 150 can then be used to correct for tip-tilt misalignment as well as confirm accurate lateral dimensions of the stamp to set indexing positions with respect to the nonplanar surface 112. A laser triangulation sensor 156 can be used to, for example, map runout errors of the nonplanar surface 112 and can be input into a compensation table for setting a pre-contact position for a stamp mounted on the surface 160.

Figure 2B:
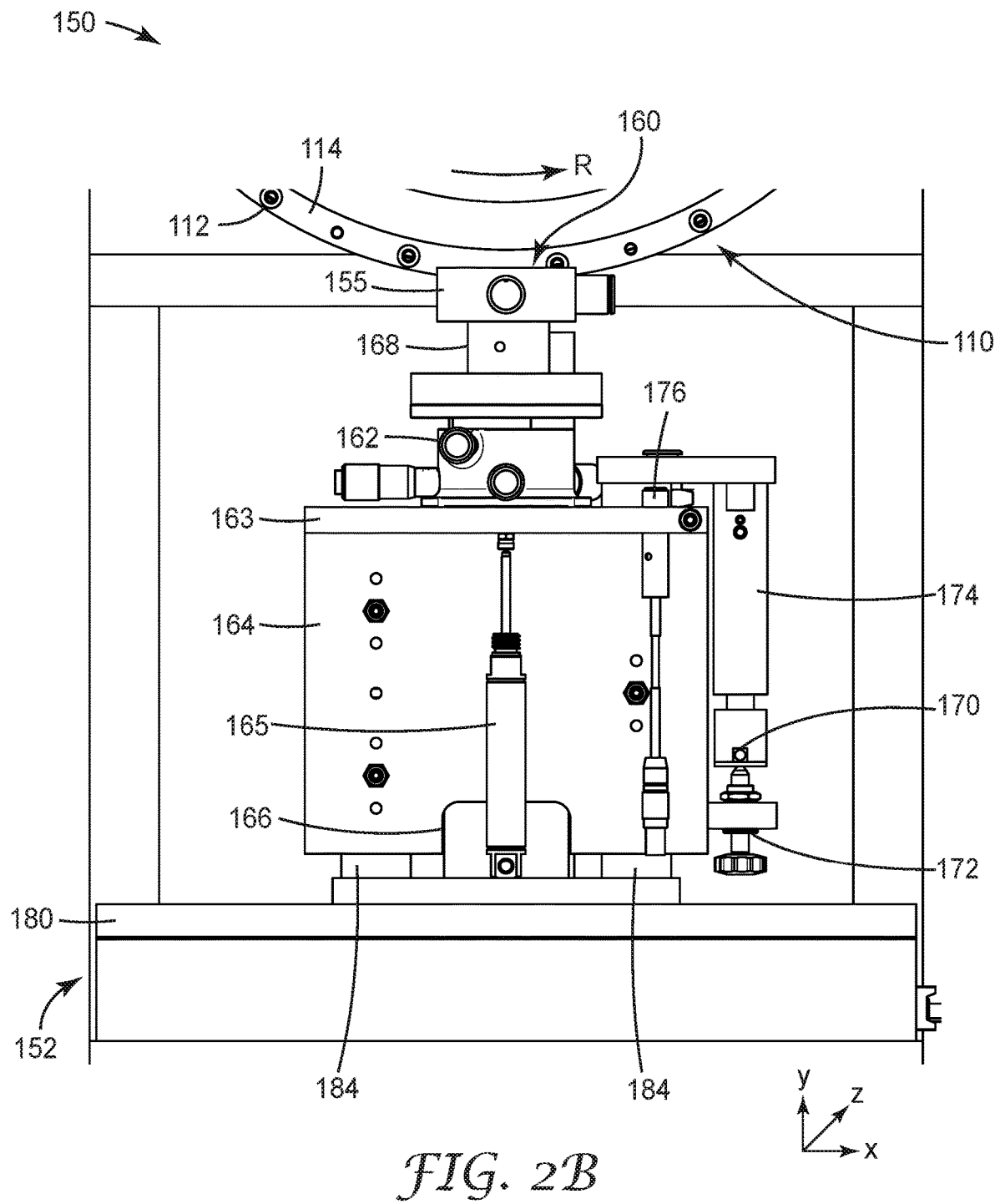
FIG. 2B is a schematic side view of a stamp module of the MCP apparatus of FIG. 2A.

Referring to FIG. 2B, a cylindrical roll 110 has a metallic nonplanar surface 112 on a support roll 114, which rotates about an axis R. The nonplanar surface 112 can be patterned by rolling contact between the nonplanar surface 112 and a stamping surface of an elastomeric stamp (not shown in FIG. 2B) mounted on a support station 155 of a stamping module 150. In some embodiments, the support station 155 is a vacuum chuck configured to hold a selected elastomeric stamp. Prior to mounting the stamp on the testbed, the compliant elastomeric stamp can optionally be bonded to a rigid or semi-rigid support substrate to provide dimensional stability (e.g. glass, metal, or ceramic shim).

To achieve rolling contact, the roll 110 is rotated in direction R while a stamp mounted on the stamping module 150 is translated along the x-direction in FIG. 2B. The speed of rotation of the roll 110 in direction R is such that the tangential surface speed of the metallic nonplanar surface 112 equals the speed of motion of the stamping module along the x-direction so that there is no slippage at the point of contact between a stamping surface of the stamp and the metallic nonplanar surface 112.

The stamp module 150 includes a stage 162 that can be configured to tip, tilt, or rotate an elastomeric stamp attached to the surface 160. The stage 162 is mounted on a platform 163, which is slideably mounted using an air bearing in housing 164 and move along shafts 184. The platform 163 is attached to at least one pneumatic counterbalance 165. The position of the platform 163 controlled by a voice coil actuator 166, which is also used to implement force control between a stamping surface of a stamp and the nonplanar surface 112 of the roll 110. Closed-loop force control at the interface between the stamping surface of the stamp and the nonplanar surface 112 is achieved with a set of two force sensors 168, 170 to provide feedback. Positive (upward) force along the y-direction is balanced between force sensors 168, 170. When a stamp mounted on the surface 160 is not in contact with the nonplanar surface 112, the force control loop is balanced completely with force sensor 170.

The pre-contact stamp position can therefore be set using a wide variety of techniques. For example, in the embodiment of FIG. 2B, which is not intended to be limiting, the pre-stamp position can be set using a coarse manual height adjustment screw 172 and a fine adjust piezo actuator 174 with positional feedback from a capacitance distance sensor 176. Once contact between a stamp and the nonplanar surface 112 has developed, the force control loop is balanced completely with force sensor 168. The transition between the force sensors 168, 170 occurs during contact initiation/separation, and in some preferred embodiments the stamp module 150 can be calibrated to ensure that the transition between force sensors occurs smoothly without rebound, particularly since the stamp contacting the nonplanar surface has elastomeric properties.

The stand 165 is mounted on a linear motion stage 180 of the moveable stage 152. Drivers control the roll spindle motion (C-axis in FIG. 2A) and move the rotation shaft 113 to coordinate with the tangential linear motion along the x-direction of the linear motion stage 180. During microcontact printing, these motions are coordinated to initiate rolling contact between the nonplanar surface 112 and the stamping surface of the stamp mounted on the surface 160.

In some embodiments, the speed of rotation of the roll 110 in direction R and the resulting tangential surface speed of metallic nonplanar surface 112 substantially equals the speed of motion of the stamping surface of the stamp mounted on the surface 160 along the x-direction so that there is substantially no slippage or distortion at the point of contact between the nonplanar metallic surface 112 and the stamping surface.

In some embodiments, prior to contacting the stamping surface of the stamp with the nonplanar surface 112, the stage 180 moves the stamp module 150 to place the mounted stamp on a trajectory that initiates a path to a predetermined point of initial contact between the pattern elements on the major surface of the stamp and the nonplanar surface 112. The point of initial printing contact between the stamp and the nonplanar surface may be determined by a detector or combination of detectors such as, for example, the manual height adjustment screw 172 for coarse adjustments and the piezo actuator 174 for finer adjustments. The stage 162 may also be adjusted to tune the relative positions of the stamping surface and the nonplanar surface and determine an initial point of contact or plot a trajectory of the stamping surface to contact the nonplanar surface at a predetermined point or region.

In various embodiments, after initiating rolling contact between the stamping surface and the nonplanar surface, the stamping surface is contacted with the nonplanar surface for a print time sufficient to chemically bind a functional group with the nonplanar surface to form a self-assembled monolayer (SAM) of a functionalizing material on the nonplanar surface and impart an arrangement of nanoscale pattern elements thereto. The stamping surface of the stamp is translated with respect to the nonplanar surface of the roll such that: (1) a contact force at an interface between the stamping surfaces on the stamp and the nonplanar surface is allowed to vary, and (2) a contact pressure at the interface is controlled while the stamping surfaces and the nonplanar surface are in contact with each other.

In various embodiments, the pressure is maintained at a substantially constant value (±5%), or is varied based on data determining the contact area at known positions along the stamping surface of the stamp necessary to provide a substantially uniform SAM on the nonplanar surface. The contact area along the surface of the stamp throughout the rolling contact printing operation, and is particularly evident at the leading and trailing edges of stamp features wherein high contact pressures can lead to stamp feature collapse. The contact area can vary based on, for example, the shape of the stamp, the dimensions of the stamping elements on the stamping surface, the arrangement of the stamping elements on the stamping surface, the composition and the compliance of the stamp, and the like. Data on contact area at known positions along the stamping surface can be obtained by several methods such as, for example, heuristic experimental approaches, finite element models, analytical deformation models, a lookup table or interpolation. With a given target contact pressure and a function defining the variation in contact area, the contact force can be calculated.

In various embodiments, the resulting interference between the nonplanar surface and the stamping surface at the unloaded point of contact is less than about 25 microns, or less than about 5 microns, or even less than about 1 micron.

Referring again to FIGS. 2A-2B, in some embodiments the linear motion stage 180 is itself mounted on a second linear motion stage 182 oriented to translate linear motion stage 180 and the rest of the apparatus 150 it supports along the z-direction, and perpendicular to the x- and y-directions. This allows additional instances of the pattern on the stamping surface to be applied in a step-and-repeat fashion onto the nonplanar surface 112 not only circumferentially, but also in a direction parallel with the axis of the cylindrical roll 110. The distance sensor 156 may be used to measure the distance from itself to the nonplanar surface 112, which can in turn be used to map the run-out on the cylindrical roll 110.

Figure 2C:
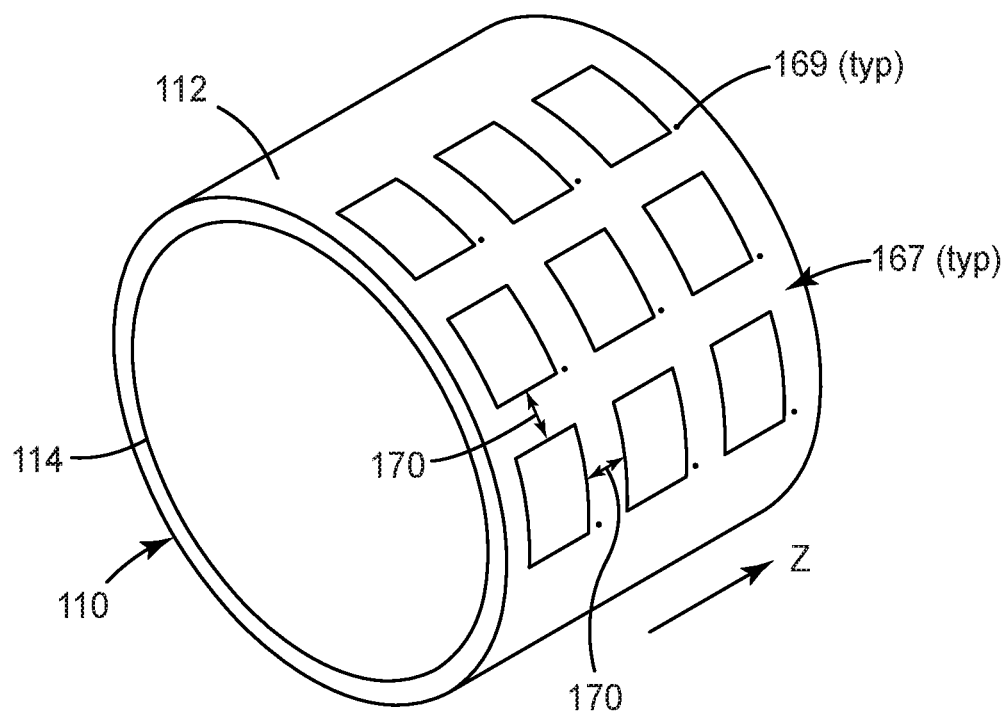
FIG. 2C is a schematic perspective view of an embodiment of a cylindrical roll that has been patterned using the MCP apparatus of the present disclosure.

For the step and repeat procedure, in one embodiment, the stamp and tool diameter are sized such that an integer number of printed stamp tiles will exactly wrap around the circumference of the tool. The stamp tiling progresses in a grid pattern on the roll and forms a patterned area that is continuous around the circumference of the roll. This embodiment is illustrated in FIG. 2C, a perspective view of cylindrical roll 110 in isolation with nine instances of a pattern 167 laid down in a step-and-repeat fashion in a three by three array on the nonplanar surface 112. The nine instances in the depicted embodiment are separated by a certain distance in either the circumferential direction or the axial direction, or both, which is referred to herein as a stitch error. However, it is contemplated in this disclosure that the instances of the pattern 167 could be immediately adjacent, or even deliberately overlapping. It is possible to regulate a gap between adjacent instances of pattern 167 on the nonplanar surface 112 with great accuracy, even to less than 2 μm.

Also seen in FIG. 2C are fiducial marks 169, each of which bear a specific positional relationship of one of the patterns 167. It is contemplated that fiducial marks 169 could be applied by the same stamp and at the same time as the pattern is applied. It is also possible that fiducial marks 169 could be applied in a separate operation. Such fiducial marks 169 are known in the art, and can in some cases be convenient when cylindrical roll 110 is used after patterning in, e.g., a roll-to-roll operation on a web and it is desirable to accurately register some secondary operation with the results of the cylindrical roll 110 upon that web.

Figure 2D:
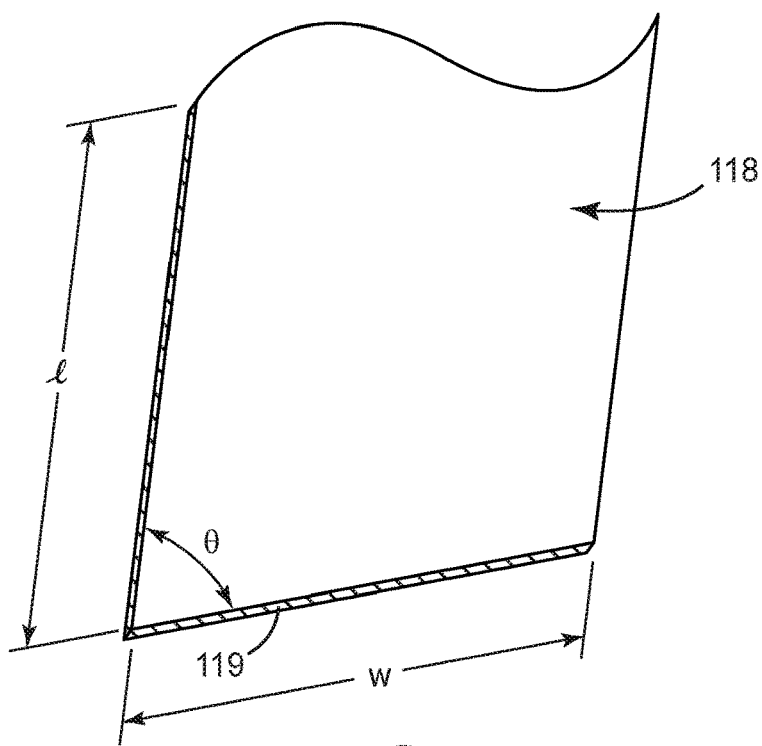
FIG. 2D is a schematic perspective view of a parallelepiped stamp with a parallelogrammatic cross-section.
Figure 2E:
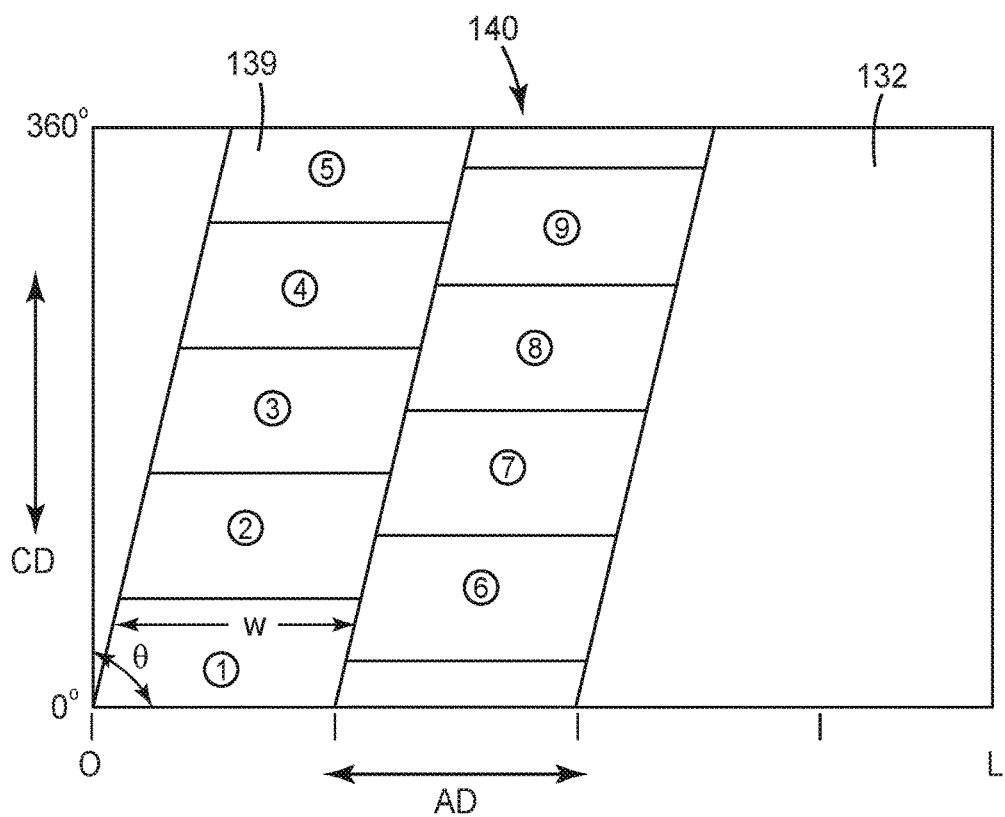
FIG. 2E is a schematic overhead view of a helical stamp pattern made on a non-planar substrate using the stamp of FIG. 2D.

In another embodiment shown in FIG. 2D, the stamp 118 is made as a parallelogram prism (parallelepiped) having a length l, a width w, and an angle θ selected to provide a cross-section 119 having the shape of a parallelogram. Referring to FIG. 2E, the parallelepiped stamp 118 of FIG. 2D can be used to transfer a pattern 140 to a non-planar circumferential tool surface 132 with parallelogrammatic tile-like pattern elements 139. As shown schematically in FIG. 2E, to form the tiled pattern 140, each successive parallelogram tile 139 (numbered 1-9 in order of application) is serially applied to the surface 132 and offset both circumferentially along the circumferential direction CD and axially along the axial direction AD on the surface 132 of the non-planar surface 132 such that the tiles are printed on the surface 132 in a helical configuration. In this arrangement, the circumference of the roll does not have to be an integer multiple of the stamp length l (FIG. 2D). While this relaxes the absolute size tolerance on the stamp length, there are additional constraints on the parallelogram angle that can be controlled to ensure the pattern area is continuous around the circumference of the roll. For example, if the width w of the stamp 118 of FIG. 2D is known, and the circumference TC of the non-planar surface 132 of the tool is known, the angle θ of the stamp can be determined by tan θ=TC/w.

In various embodiments, the presently described microcontact printing process can impart an array of nanoscale pattern elements, each with a lateral dimension of less than about 5 microns, to a nonplanar surface of a roll. The array includes a plurality of tile-like elements arranged such that adjacent tile-like elements are separated by less than about 10 μm, less than 5 μm, less than 1 μm, or less than 0.1 μm, or even less than 0.02 μm, or overlapping by a predetermined amount of less than about 10 μm, less than 5 μm, less than 1 μm, or less than 0.1 μm, or even less than 0.02 μm. These small patterns may be applied over a nonplanar surface of a cylindrical roller with a height of about 9 inches (23 cm) and a base with a diameter of 12.75 inches (32.39 cm), which can be used in a roll-to-roll manufacturing process.

Figure 3:
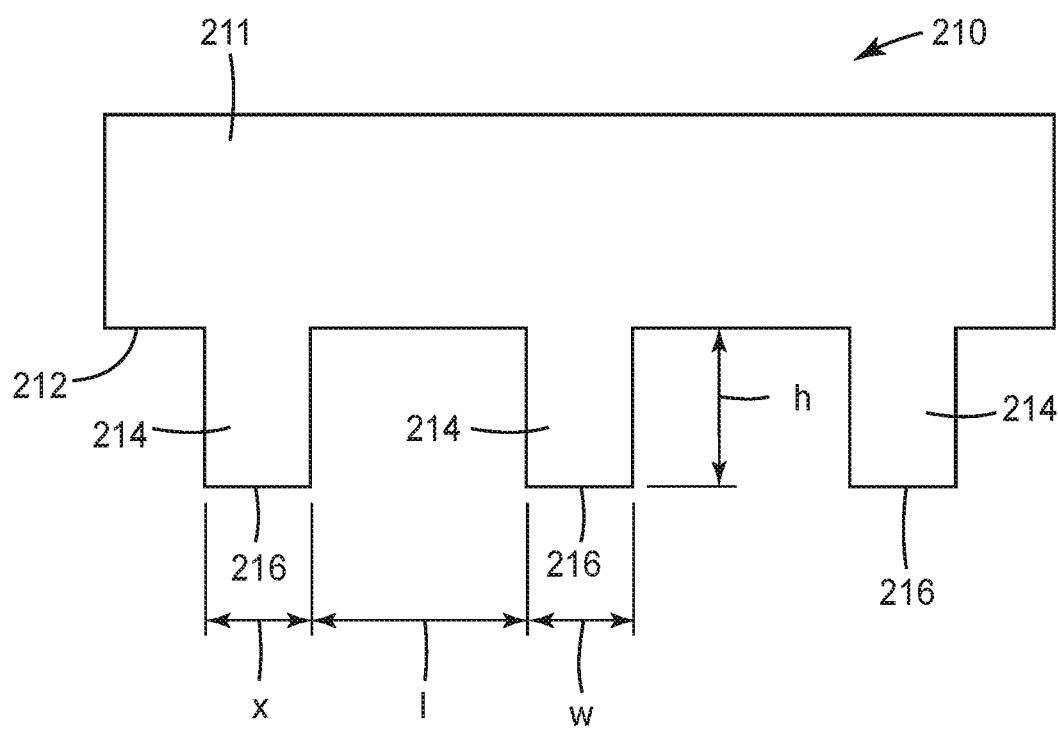
FIG. 3 is a schematic cross-sectional view of an embodiment of a stamp for microcontact printing.

FIG. 3 shows a schematic illustration of a portion of a microcontact printing stamp 210, which includes a substantially planar base surface 212. An array of pattern elements 214 extends away from the base surface 212. In some embodiments, the stamp 210 is a unitary block of an elastomeric material, and in other embodiments may include elastomeric pattern elements 214 supported by an optional reinforcing backing layer 211. The array of pattern elements 214 on the base surface 212 of the stamp 210 can vary widely depending on the intended microcontact printing application, and can include, for example, regular or irregular patterns of elements such as lines, dots, polygons, and combinations thereof.

The pattern elements 214 in the array on the base surface 212 can be described in terms of their shape, orientation, and size. The pattern elements 214 have a base width x at the base surface 212, and include a stamping surface 216. The stamping surface 216 resides a height h above the base surface 212, and has a lateral dimension w, which may be the same or different from the base width x. In various embodiments, the aspect ratio of the height h of the pattern elements 214 to the width w of the stamping surface 216 of the pattern elements 214 is about 0.1 to about 5.0, about 0.2 to about 3.0, or about 0.2 to about 1.0.

The methods and apparatuses described herein are particularly advantageous for small pattern elements 214 with a stamping surface 216 having a minimum lateral dimension w of less than about 10 µm, or less than about 5 µm, or less than about 1 µm. In the embodiment shown in FIG. 3, the stamping surface 216 is substantially planar and substantially parallel to the base surface 212, although such a parallel arrangement is not required. The methods and apparatuses reported herein are also particularly advantageous for microcontact printing with pattern elements 214 having a height h of about 50 µm or less, or about 10 µm or less, or about 5 µm or less, or about 1 µm or less, or about 0.25 µm or less.

The pattern elements 214 can occupy all or just a portion of the base surface 212 (some areas of the base surface 12 can be free of pattern elements). For example, in various embodiments the spacing l between adjacent pattern elements can be greater than about 50 µm, or greater than about 100 µm, or greater that about 200 µm, or greater than about 300 µm, or greater than about 400 µm, or even greater than about 500 µm. Commercially useful arrays of pattern elements 14 for microcontact printing cover areas of, for example, about 0.1 cm² to about 1000 cm², or about 0.1 cm² to about 100 cm², or about 5 cm² to about 10 cm² on the base surface 212 of the stamp 210.

In some embodiments, the pattern elements 214 can form a "micropattern," which in this application refers to an arrangement of dots, lines, filled shapes, or a combination thereof having a dimension (e.g. line width) of about 1 µm to about 1 µm. In some embodiments, the arrangement of dots, lines, filled shapes, or a combination thereof have a dimension (e.g. line width) of at least: 0.5 µm and typically no greater than 20 µm. The dimension of the micropattern pattern elements 214 can vary depending on the micropattern selection, and in some embodiments, the micropattern pattern elements have a dimension (e.g. line width) that is less than 10, 9, 8, 7, 6, or 5 µm (e.g. 0.5-5 µm or 0.75-4 µm).

In some embodiments, the pattern elements 214 can form a "nanopattern," which in this application refers to an arrangement of dots, lines, filled shapes, or a combination thereof having a dimension (e.g. line width) of about 10 µm to about 1 µm. In some embodiments, the arrangement of dots, lines, filled shapes, or a combination thereof have a dimension (e.g. line width) of about 100 nm to about 1 µm. The dimension of the nanopattern pattern elements 214 can vary depending on the nanopattern selection, and in some embodiments, the nanopattern pattern elements have a dimension (e.g. line width) that is less than 750 nm, or less than 500 less than 250 µm, or less than 150 nm.

In some embodiments, combinations of micropattern elements and nanopattern elements may be used.

In some embodiments, the pattern elements are traces, which may be straight or curved. In some embodiments, the pattern elements are traces that form a two-dimensional network (i.e., mesh). A mesh comprises traces that bound open cells. The mesh may be, for example, a square grid, a hexagonal mesh, or a pseudorandom mesh. Pseudorandom refers to an arrangement of traces that lacks translational symmetry, but that can be derived from a deterministic fabrication process (e.g., photolithography or printing), for example including a computational design process that includes generation of the pattern geometry with a randomization algorithm. In some embodiments, the mesh has an open area fraction of between 90 percent and 99.75 percent (i.e., density of pattern elements of between 0.25 percent and 20 percent). In some embodiments, the mesh has an open area fraction of between 95 percent and 99.5 percent (i.e., density of pattern elements of between 0.5 percent and 5 percent). The pattern elements may have combinations of the aspects described above, for example they may be curved traces, form a pseudorandom mesh, have a density of between 0.5 percent and 5 percent, and have a width of between 0.5 µm and 5 µm. In other embodiments, the pattern elements may have a density of pattern elements of greater than 20%, or greater than 60%, or greater than 80%, or even greater than 90%, and may appear as a dark background with a small open area fraction.

Figure 4A:
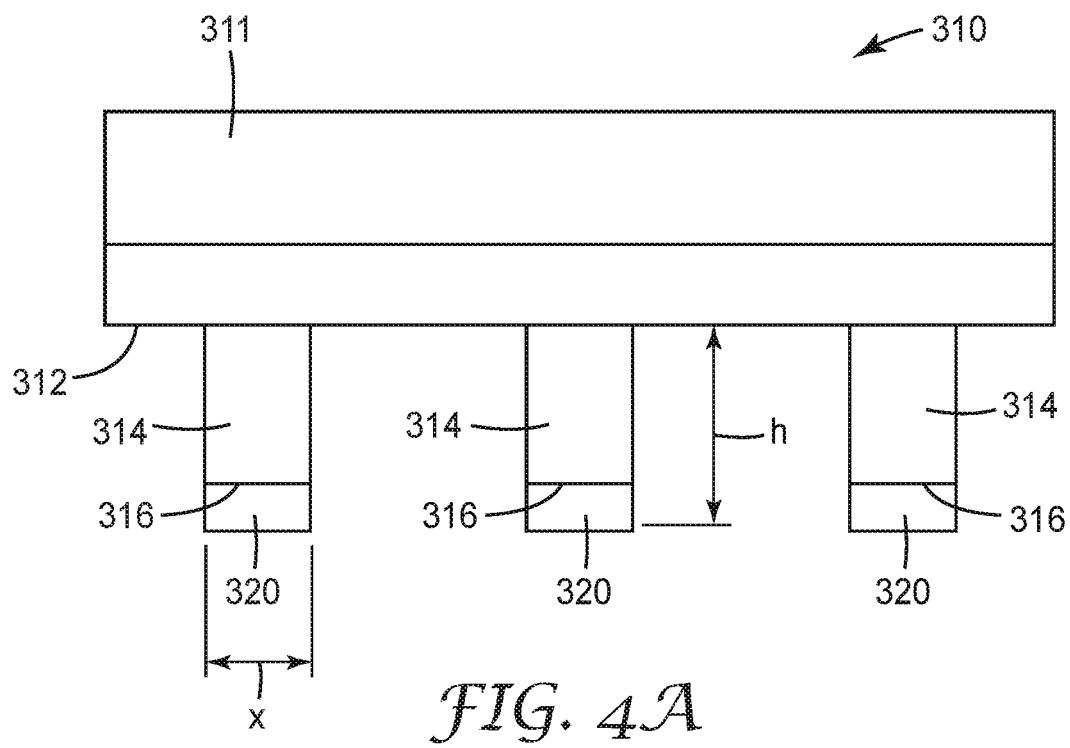
FIGS. 4A-4B are schematic cross-sectional views of a process for forming a self-assembled monolayer (SAM) on a substrate using a high-aspect ratio stamp in a microcontact printing process.

Referring to FIG. 4A, an ink 320 including a functionalizing molecule is absorbed into a stamp 310, and resides on the stamping surfaces 316 of the stamp 310. The functionalizing molecules in the ink 320 include a functional group selected to bind to a selected surface material 322 on a nonplanar surface. The nonplanar surface is supported by a support layer 324, which in some embodiments may be a portion of a cylindrical roll (not shown in FIG. 4).

Figure 4B:
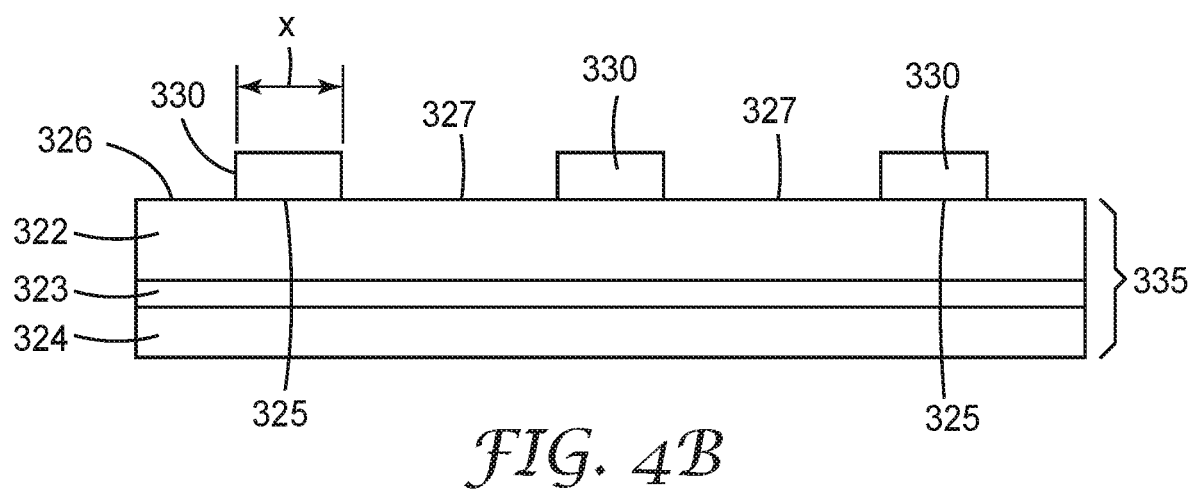

Referring to FIG. 4B, the stamp 310 is positioned and is brought into contact with a tool substrate 335. The tool substrate 335 includes a print layer 322 with a nonplanar surface 326, a tooling layer 323, and a cylindrical roll substrate 324. In various embodiments, which are not intended to be limiting, the tooling layer 323 is a hard, reactive ion etchable (RIE) material such as, for example, metals or metal alloys chosen from, for example, aluminum, tungsten, and alloys and combinations thereof, non-metallic inorganics like glass, quartz, silicon, diamond-like glass (DLG) or diamond-like carbon (DLC). The cylindrical roll substrate 324 is a metal suitable for use in diamond turning operations, and non-limiting examples include copper, aluminum, and alloys and combinations thereof. The cylindrical roll substrate may consist of multiple materials as one skilled in the art would recognize would enable diamond turning of the surface while providing a more robust underlying structure, such as copper on steel. Materials for the print layer 322 will be discussed in more detail below. Additionally, one or more optional adhesion promoter layers may be used to enhance adhesion between layers. The adhesion promoter layers are typically a few nanometers thick and are not shown in FIG. 4.

The stamping surfaces 316 contact a first portion 325 of the surface 326. The functionalizing molecules in the ink 320 contact the surface 326 for a print time sufficient to allow the functional group to chemically bind thereto (contacting step not shown in FIG. 4B). In various embodiments, the print time is from about 0.001 seconds to about 5 seconds, or about 0.010 seconds to about 1 seconds.

Then, the stamping surface 316 is removed, and the ink remaining on the surface 326 forms a self-assembled monolayer (SAM) 330 on the portions 325 of the surface 326 according to the shapes and dimensions of the stamping surfaces 316. Portions 327 of the surface 326, contiguous with first portions 325, remain free of the SAM 330.

Figure 4C:
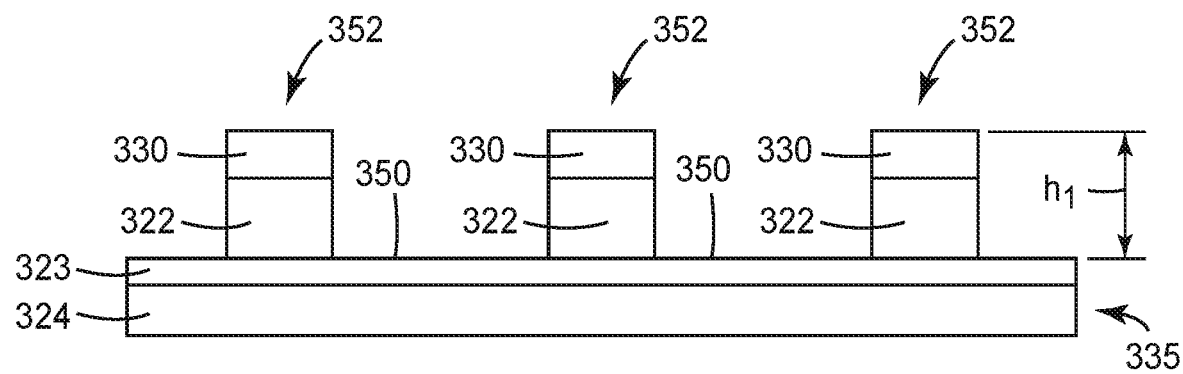
FIGS. 4C-4D are schematic cross-sectional views of a process for making a tool using the SAM of FIGS. 4A-4B.

Referring to FIG. 4C, portions 327 of the print layer 322 not underlying the SAM 330 are removed by any suitable process such as, for example, wet chemical etching, to form pattern elements 352 having a height h1 of less than about 500 nm, or less than about 250 nm, or less than about 100 nm, or less than about 50 nm. The etching process further exposes regions 350 of the tooling. layer 323.

Figure 4D:
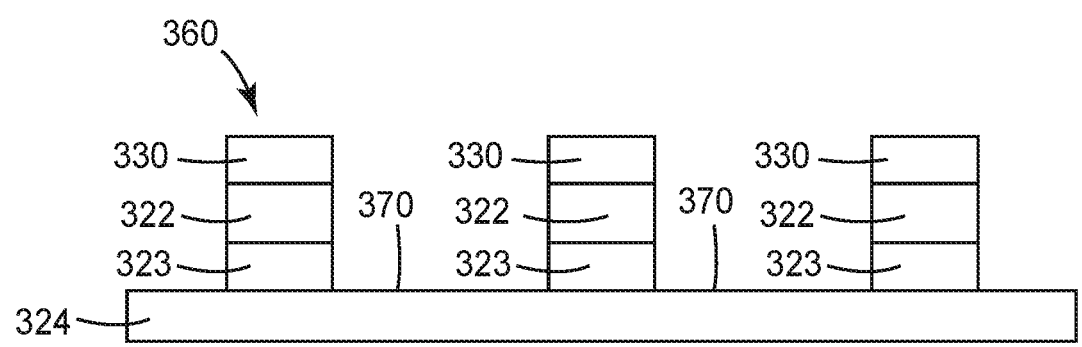

Referring to FIG. 4D, the remaining portions of the tool substrate 335 can optionally be further processed by an additional etch using, for example, reactive ion etching (RIE), to remove portions of the tooling layer 323 not overlain by the pattern elements 352. The RIE process produces high aspect ratio pattern elements 360 with an aspect ratio of about 0.1 to about 10, or about 0.25 to about 7, and in some embodiments may optionally expose regions 370 of the cylindrical roll substrate 324.

In an optional further processing step not shown in FIGS. 4A-D, the tool substrate 335 can be further treated to strip away the SAM 330 and the print layer 322 in the high aspect ratio pattern elements 360, leaving behind portions of the tooling layer 323 on the cylindrical roll substrate 324.

The stamp 310 used in the MCP processes of the present disclosure should be sufficiently elastic to allow the stamping surfaces 316 to very closely conform to minute irregularities in the surface 326 of the print layer 322 and completely transfer the ink 320 thereto. This elasticity allows the stamp 310 to accurately transfer the functionalizing molecules in the ink 320 to nonplanar surfaces. However, the pattern elements 314 should not be so elastic that when the stamping surfaces 316 are pressed lightly against a surface 326, the pattern elements 314 deform to cause blurring of the ink 320 on the substrate surface 326.

The stamp 310 should also be formed such that stamping surface 316 includes an absorbent material selected to absorb the ink 320 to be transferred to a surface 326 to form a SAM 330 thereon. The stamping surface 316 can swells to absorb the ink 320, which can include functionalizing molecules alone or suspended in a carrier such as an organic solvent. In some cases, such swelling and absorbing characteristics can provide good definition of an isolated SAM 330 on a substrate surface 326, but in general should be minimized to improve dimensional control over the stamping surface 316. For example, if a dimensional feature of stamping surface 316 has a particular shape, the surface 316 should transfer the ink 320 to the surface 326 of the print layer 322 to form SAMs 30 mirroring the features of the stamping surface 316, without blurring or smudging. The ink is absorbed into the stamping surface 316, and when stamping surface 316 contacts material surface 326, the ink 320 is not dispersed, but the functional groups on the functionalizing molecules chemically bind to the surface 326, and removal of the stamping surface 316 from the surface 326 results in a SAM 330 with well-defined features.

Useful elastomers for forming the stamp 310 include polymeric materials such as, for example, silicones, polyurethanes, ethylene propylene diene M-class (EPDM) rubbers, as well as commercially available flexographic printing plate materials (for example, those commercially available from E. I. du Pont de Nemours and Company, Wilmington, Del., under the trade designation Cyrel). The stamp can be made from a composite material including, for example, an elastomeric material on the stamping surfaces 316 combined with a woven or non-woven fibrous reinforcement 311 (FIG. 4A).

Polydimethylsiloxane (PDMS) is particularly useful as a stamp material, as it is elastomeric and has a low surface energy (which makes it easy to remove the stamp from most substrates). A useful commercially available formulation is available from Dow Corning, Midland, Mich., under the trade designation Sylgard 184 PDMS. PDMS stamps can be formed, for example, by dispensing an un-crosslinked PDMS polymer into or against a patterned mold, followed by curing. The master tool for molding the elastomeric stamps can be formed using lithography techniques (e.g. photolithography, e-beam) known in the art. The elastomeric stamp can be molded against the master tool by applying uncured PDMS to the master tool and then curing.

The print layer 322 and the ink 320 are selected such that the functionalizing molecules therein include a functional group that binds to a surface 326 of the layer 322. The functional group may reside at the physical terminus of a functionalizing molecule as well as any portion of a molecule available for forming a bond with the surface 326 in a way that the molecular species can form a SAM 330, or any portion of a molecule that remains exposed when the molecule is involved in SAM formation. In some embodiments, the functionalizing molecules in the ink 320 may be thought of as having first and second terminal ends, separated by a spacer portion, the first terminal end including a functional group selected to bond to surface 326, and the second terminal group optionally including a functional group selected to provide a SAM 330 on material surface 326 having a desirable exposed functionality. The spacer portion of the molecule may be selected to provide a particular thickness of the resultant SAM 330, as well as to facilitate SAM formation and control transport mechanisms (e.g. vapor transport). Although SAMs of the present invention may vary in thickness, SAMs having a thickness of less than about 50 Å are generally preferred, more preferably those having a thickness of less than about 30 Å and more preferably those having a thickness of less than about 15 Å. These dimensions are generally dictated by the selection of molecular species 20 and, in particular, the spacer portion thereof.

Additionally, SAMs 330 formed on surface 326 may be modified after such formation for a variety of purposes. For example, a functionalizing molecule in the ink 320 may be deposited on surface 326 in a SAM, the functionalizing molecule having an exposed functionality including a protecting group which may be removed to effect further modification of the SAM 330. Alternately, a reactive group may be provided on an exposed portion of the functionalizing molecule in the ink 320 that may be activated or deactivated by electron beam lithography, x-ray lithography, or any other radiation. Such protections and de-protections may aid in chemical or physical modification of an existing surface-bound SAM 330.

The SAM 330 forms on the surface 326 of the print layer 322. The substrate surface 326 can be substantially planar and have a slight curvature, or may have a significant curvature like the surfaces of a cylindrical roller described above. Useful materials for the print layer 322 can include an inorganic material (for example, metallic or metal oxide material, including polycrystalline materials) coating on a metal or glass support layer. The inorganic material for the print layer 322 can include, for example, elemental metal, metal alloys, intermetallic compounds, metal oxides, metal sulfides, metal carbides, metal nitrides, and combinations thereof. Exemplary metallic print layers 322 for supporting SAMs include gold, silver, palladium, platinum, rhodium, copper, nickel, iron, indium, tin, tantalum, aluminum, as well as mixtures, alloys, and compounds of these elements. Gold is a preferred metallic surface 322.

The print layer 322 on the supporting substrate 324 can be any thickness such as, for example, from about 10 nanometers (nm) to about 1000 nm. The inorganic material coating can be deposited using any convenient method, for example sputtering, evaporation, chemical vapor deposition, or chemical solution deposition (including electroless plating) as well as other methods known in the art.

In one embodiment, combinations of materials for the print layer 322 and functional groups for functionalizing molecules in the ink 320 include, but are not limited to: (1) metals such as gold, silver, copper, cadmium, zinc, palladium, platinum, mercury, lead, iron, chromium, manganese, tungsten, and any alloys of the above with sulfur-containing functional groups such as thiols, sulfides, disulfides, and the like.

Additional suitable functional groups on the functionalizing molecules in the ink 320 include acid chlorides, anhydrides, sulfonyl groups, phosphoryl groups, hydroxyl groups and amino acid groups. Additional surface materials for the print layer 322 include germanium, gallium, arsenic, and gallium arsenide. Additionally, epoxy compounds, polysulfone compounds, plastics and other polymers may find use as the material for the print layer 322. Additional materials and functional groups suitable for use in the present invention can be found in U.S. Pat. Nos. 5,079,600 and 5,512,131, which are incorporated herein by reference in their entirety.

Referring again to FIGS. 4A-4D, in some embodiments, the functionalizing molecules utilized to form SAMs in the presently-described process are delivered to the stamp 310 as ink solutions 320 including one or more organosulfur compounds as described in U.S. Published Application No. 2010/0258968, incorporated herein by reference. Each organosulfur compound is preferably a thiol compound capable of forming a SAM 330 on a selected surface 326 of a print layer 322. The thiols include the —SH functional group, and can also be called mercaptans. The thiol group is useful for creating a chemical bond between molecules of the functionalizing compound in the ink 320 and the surface 322 of a metal print layer. Useful thiols include, but are not limited to, alkyl thiols and aryl thiols. Other useful organosulfur compounds include dialkyl disulfides, dialkyl sulfides, alkyl xanthates, dithiophosphates, and dialkylthiocarbamates.

Preferably the ink solution 320 includes alkyl thiols such as, for example, linear alkyl thiols: $HS(CH_2)_nX$, wherein n is the number of methylene units and X is the end group of the alkyl chain (for example, X=—$CH_3$, —OH, —COOH, —$NH_2$, or the like). Preferably, X=—$CH_3$. Other useful functional groups include those described, for example, in: (1) Ulman, "Formation and Structure of Self-Assembled Monolayers," Chemical Reviews Vol. 96, pp. 1533-1554 (1996); and (2) Love et al., "Self-Assembled Monolayers of Thiolates on Metals as a Form of Nanotechnology," Chemical Reviews Vol. 105, pp. 1103-1169 (2005).

Useful alkyl thiols can be linear alkyl thiols (that is, straight chain alkyl thiols) or branched, and can be substituted or unsubstituted. The optional substituents preferably do not interfere with the formation of a SAM. Examples of branched alkyl thiols that are useful include alkyl thiols with a methyl group attached to every third or every fourth carbon atom of a linear alkyl chain backbone (for example, phytanylthiol). Examples of mid-chain substituents within useful alkyl thiols include ether groups and aromatic rings. Useful thiols can also include three-dimensional cyclic compounds (for example, 1-adamantanethiol).

Preferred linear alkyl thiols have 10 to 20 carbon atoms (more preferably, 12 to 20 carbon atoms; most preferably 16 carbon atoms, 18 carbon atoms, or 20 carbon atoms).

Suitable alkyl thiols include commercially available alkyl thiols (Aldrich Chemical Company, Milwaukee, Wis.). Preferably, the ink solutions 320 consist primarily of a solvent and the organosulfur compound, with impurities including less than about 5% by weight of the ink solution; more preferably less than about 1%; even more preferably less than about 0.1%. Useful inks 320 can contain mixtures of different organosulfur compounds dissolved in a common solvent such as, for example, mixtures of alkyl thiol and dialkyl disulfide.

Aryl thiols, which include a thiol group attached to an aromatic ring, are also useful in the ink 320. Examples of useful aryl thiols include biphenyl thiols and terphenyl thiols. The biphenyl and terphenyl thiols can be substituted with one or more functional groups at any of a variety of locations. Other examples of useful aryl thiols include acene thiols, which may or may not be substituted with functional groups.

Useful thiols can include linear conjugated carbon-carbon bonds, for example double bonds or triple bonds, and can be partially or completely fluorinated.

The ink solutions 320 can include two or more chemically distinct organosulfur compounds. For example, the ink can include two linear alkyl thiol compounds, each with a different chain length. As another example, the ink 320 can include two linear alkyl thiol compounds with different tail groups.

Although microcontact printing has been carried out using neat organosulfur compounds to ink the stamp, the delivery of organosulfur compounds to the stamp can be achieved more uniformly, and with less stamp swelling in the case of linear alkyl thiols and PDMS stamps, if delivered from a solvent-based ink. In some embodiments, the ink includes more than one solvent, but most useful formulations need include only a single solvent. Inks formulated with only one solvent may contain small amounts of impurities or additives, for example stabilizers or desiccants.

Useful solvents are preferably compatible with PDMS (that is, they do not excessively swell PDMS), which is the most commonly used stamp material for microcontact printing. In microcontact printing, swelling of the PDMS stamp can lead to distortion of the patterned features and poor pattern fidelity. Depending on the inking approach, excessive swelling can also present significant challenges in providing mechanical support to the stamp.

Ketones can be suitable solvents for the ink solutions. In some embodiments, suitable solvents include, for example, acetone, ethanol, methanol, methyl ethyl ketone, ethyl acetate, and the like, and combinations thereof. In some embodiments, the solvents are acetone and ethanol. The one or more organosulfur compounds (for example, thiol compounds) are present in the solvent in a total concentration of at least about 3 millimoles (mM). As used herein, the "total concentration" refers to the molar concentration of all the dissolved organosulfur compounds taken in aggregate. The one or more organosulfur compounds (for example, thiol compounds) can be present in any total concentration in which the ink solution consists of essentially a single phase. The one or more organosulfur compounds (for example, thiol compounds) can be present in total concentrations of at least about 5 mM, at least about 10 mM, at least about 20 mM, at least 50 mM, and even at least about 100 mM.

The stamp 310 can be "inked" with the ink solution 320 described herein using methods known in the art (for example, as described in Libioulle et al. "Contact-Inking Stamps for Microcontact Printing of Alkanethiols on Gold," Langmuir Vol. 15, pp. 300-304 (1999)). In one approach, an applicator (for example, a cotton swab or a foam applicator) impregnated with the ink solution 320 can be rubbed across the stamping surfaces 16 of the stamp 310, followed by drying of solvent from the stamping surfaces 316. In another approach, the stamping surfaces 316 can be pressed against an "ink pad" impregnated with the ink solution, the ink pad optionally being a PDMS slab. In another approach, the stamp can be charged with ink solution from its back side, relative to the printing surface. In the latter approach, the organosulfur compound diffuses through the stamp to reach the relief-patterned face (the face including the planar surface 312 and the pattern elements 314 with the stamping surfaces 316) for printing. In another embodiment, the relief-patterned printing face of the stamp can be immersed in the ink solution, followed by withdrawal and drying ("immersive inking").

The devices of the present disclosure will now be further described in the following non-limiting examples.

EXAMPLES

Example 1

A silver-coated PET film was wrapped onto a surface of a cylindrical roll. A PDMS stamp with dimensions of approximately 2 cm×3 cm was saturated with a 10 mM thiol solution in ethanol, and the solution was allowed to penetrate into the stamp for a time of about 30 minutes to about 10 hours.

The stamp was attached to a vacuum chuck in a stamping module shown schematically in FIGS. 2A-2B. Using optical alignment methods, the tool was aligned to the tool coordinate system. While actively maintaining alignment, the surface speeds of the flat stamp and the tool substrate were coordinated.

After contact between the stamp and tool substrate was initiated, contact force was varied to maintain a constant contact pressure. Contact area varied throughout the rolling contact printing operation, and this variation is particularly evident at the leading and trailing edges of the stamp where high contact pressures can lead to stamp feature collapse.

To maintain constant contact pressure, contact force can be varied as follows:

$$F_c = P_c * A_c \quad (1)$$

where $F_c$ is the contact force, $P_c$ is the contact pressure, and $A_c$ is the contact area. The contact area can be determined through several methods, including, for example, heuristic experimental approaches, finite element models, analytical deformation models, etc. With a given target contact pressure and a function defining the variation of contact area, the contact force can be calculated.

Figure 5:
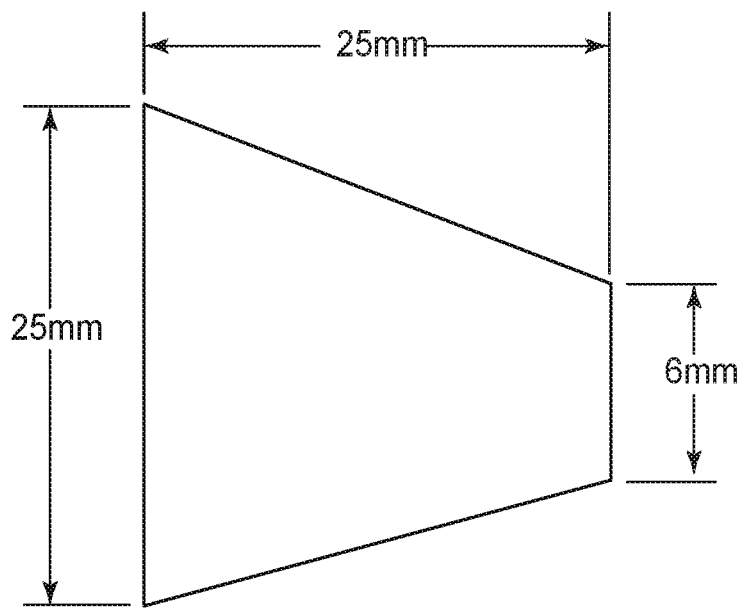
FIG. 5 is a schematic top view of a trapezoidal stamp feature on a microcontact printing stamp of Example 1.

To exemplify this effect, this example will primarily focus on printing of a trapezoidal stamp. For a trapezoidal-shaped stamp, the printing width will vary throughout the rolling contact printing operation. For a given contact force, the contact area will naturally vary as well. FIG. 5 shows a top view of the stamp used in this example.

Figure 6:
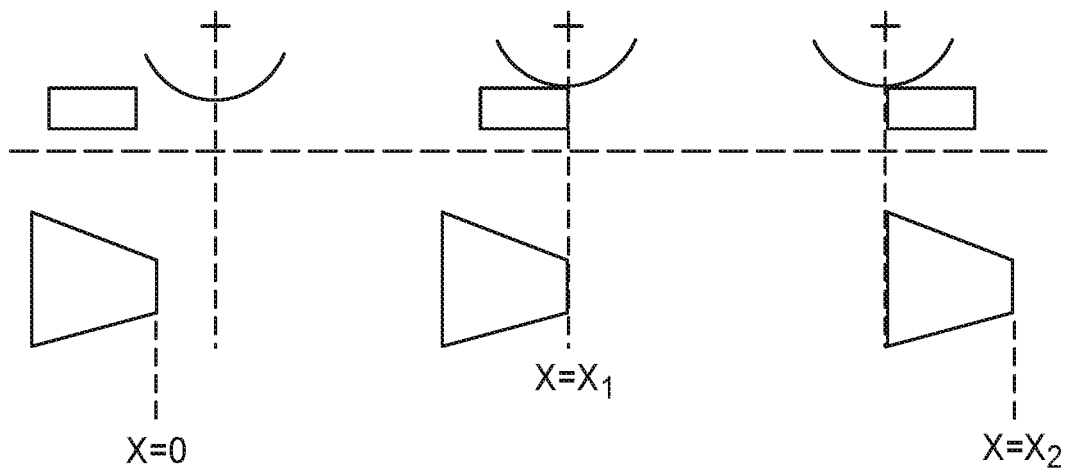
FIG. 6 is a schematic diagram showing the lateral positions of the stamp feature of FIG. 5 at an interface with a nonplanar surface.

Using the trapezoid stamp, printing at constant contact force will result in variation in contact pressure for different lateral positions. FIG. 6 defines the lateral position of the stamp in the rolling contact printing operation.

Figure 7:
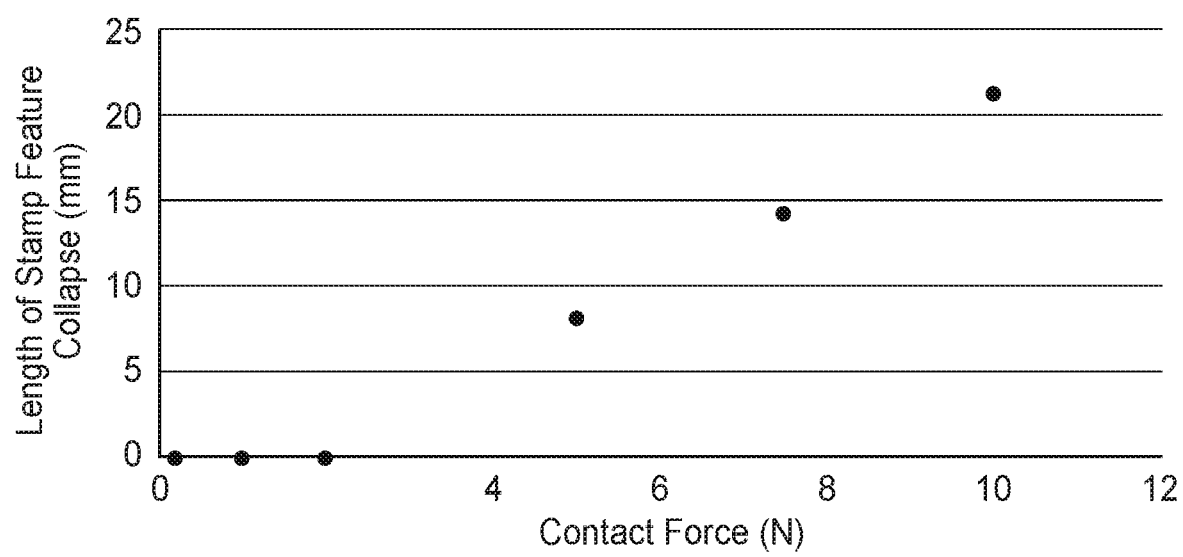
FIG. 7 is a plot of stamp feature collapse length vs. contact force for the stamp feature of FIG. 5 and Example 1.
Figure 8:
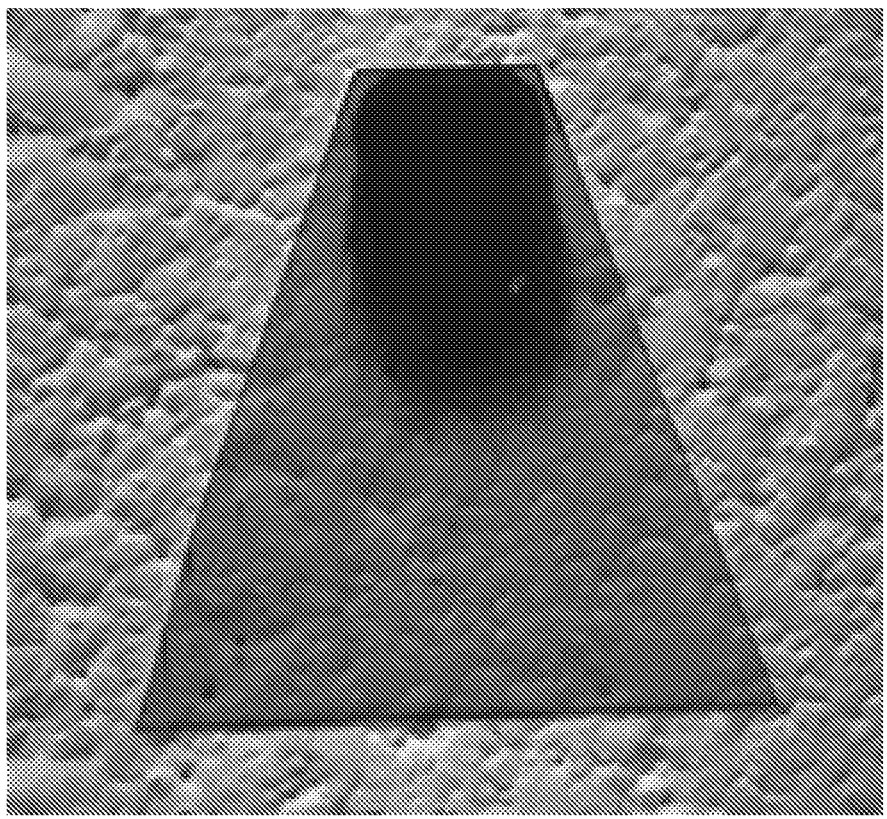
FIG. 8 is a photograph of a region of a collapsed stamp feature obtained in Example 1.

By applying a constant contact force with the trapezoid stamp, stamp feature collapse will occur at different lateral positions corresponding to different stamp widths. Note that stamp feature collapse is dependent on the shape and size of the printed pattern. The length of stamp feature collapse is provided in FIG. 7 for different constant contact forces. FIG. 8 provides an image of a printed trapezoid printed features and collapsed features with a constant 8N of contact force, with the dark regions showing areas of feature collapse.

Figure 9:
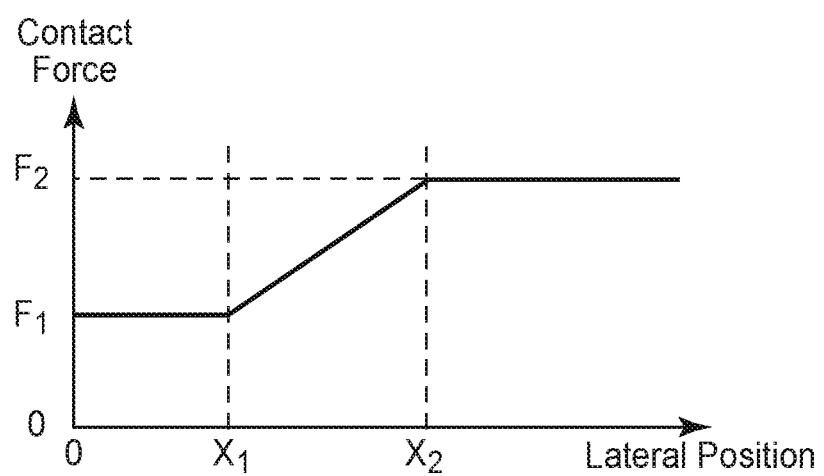
FIG. 9 is a plot of contact force vs. lateral position for a varying contact force trajectory as a function of lateral position for the stamp features of Example 1.

For the combination of high contact force and narrow stamp width, the load capacity of the PDMS feature protrusions is exceeded, which leads to stamp feature collapse. While it is possible to print with lower contact pressures such that stamp collapse is not observed, in some situations, it is desirable to print with higher contact pressures to ensure conformal contact across the entire stamp is attained for non-flat stamps. By varying the contact force as a function of lateral position, the contact pressure can the maintained to be substantially constant. FIG. 9 provides the trajectory of contact force variation as a function of lateral stamp position.

Figure 10A:
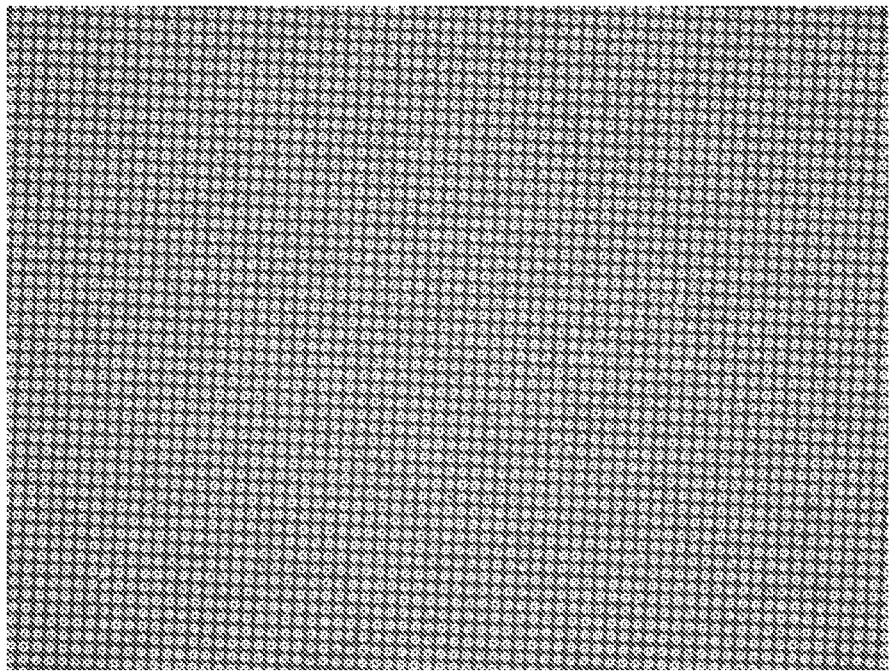
FIG. 10A is a photograph of a printed pattern formed by a varying contact force trajectory in Example 1.
Figure 10B:
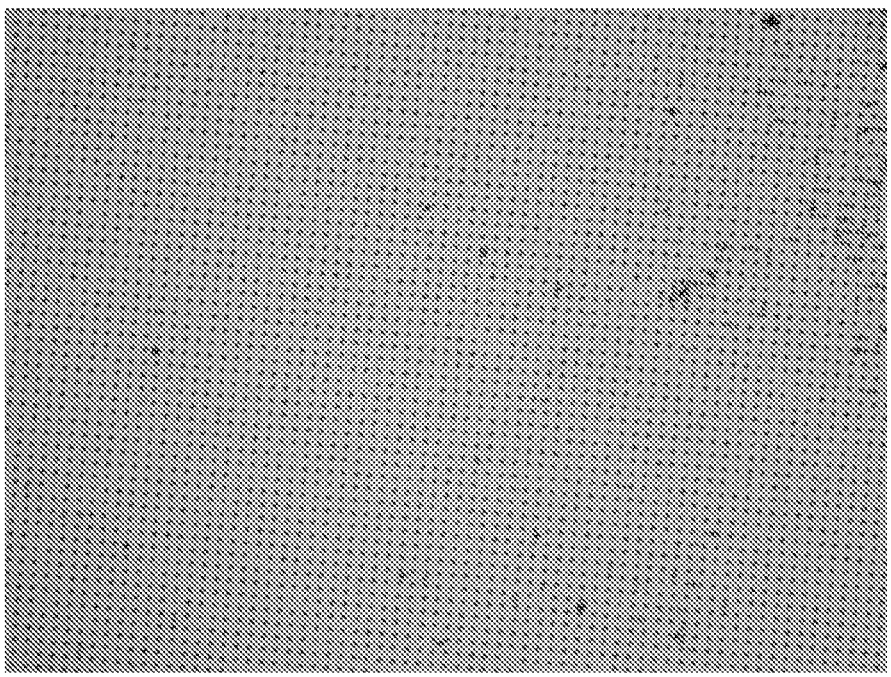
FIG. 10B is a photograph of a printed pattern produced with collapsed features formed with a constant contact force in Example 1.

By setting $F_1$ to 1.9N and $F_2$ to 8.0N, a substantially constant contact pressure can be maintained. Using this contact force trajectory, stamp feature collapse was not observed in the bulk of the trapezoid stamp. FIG. 10A shows an image of the printed features using the varying force trajectory whereas FIG. 10B shows the collapsed features using a constant 8.0 N contact force.

EMBODIMENTS

Embodiment A. A method of applying a pattern to a nonplanar surface, wherein at least a portion of the nonplanar surface has a radius of curvature, the method comprising:

providing a stamp with a major surface comprising a relief pattern of pattern elements extending away from a base surface, and wherein each pattern element comprises a stamping surface with a lateral dimension of greater than 0 and less than about 5 microns;

applying an ink on the stamping surface, the ink comprising a functionalizing molecule with a functional group selected to chemically bind to the nonplanar surface; positioning the stamp to initiate rolling contact between the nonplanar surface and the major surface of the stamp;

contacting the stamping surface of the pattern elements with the nonplanar surface to form a self-assembled monolayer (SAM) of the functionalizing material on the nonplanar surface and impart the arrangement of pattern elements thereto; and translating the major surface of the stamp with respect to the nonplanar surface, wherein translating the major surface of the stamp comprises:

(1) controlling a contact pressure at an interface between the stamping surfaces and the nonplanar surface, and (2) allowing the contact force at the interface to vary while the stamping surfaces and the nonplanar surface are in contact with each other.

Embodiment B. The method of Embodiment A, wherein the pressure is controlled to maintain a substantially constant contact pressure at the interface.

Embodiment C. The method of Embodiment A, wherein the contact pressure is controlled based on contact area at known positions on the stamping surface.

Embodiment D. The method of Embodiment C, wherein the contact area is at known positions on the stamping surface is obtained experimentally.

Embodiment E. The method of Embodiment C, wherein the contact area is at known positions on the stamping surface is obtained from modeling.

Embodiment F. The method of Embodiment A, further comprising removing the stamping surfaces of the pattern elements from the nonplanar surface.

Embodiment G. The method of Embodiment A, wherein the stamp and the nonplanar surface are translated at substantially the same surface speed.

Embodiment H. The method of Embodiment A, further comprising repositioning the stamp to apply the arrangement of pattern elements to a plurality of different portions of the nonplanar surface in a step and repeat fashion.

Embodiment I. The method of Embodiment A, wherein prior to contacting the major surface of the stamp with the nonplanar surface, placing the stamp on a trajectory that initiates a path to a predetermined point of initial contact between the pattern elements on the major surface of the stamp and the nonplanar surface.

Embodiment J. The method of Embodiment I, wherein the point of initial contact between the stamping surfaces and the nonplanar surface is determined by a detector.

Embodiment K. The method of Embodiment J, wherein after the translating of the stamp, the stamp disengages from the nonplanar surface, and further wherein the disengagement of the stamp is detected by a detector.

Embodiment L. The method of Embodiment K, wherein after disengagement, the stamp is restored to a starting position.

Embodiment M. The method of Embodiment J, wherein the interference between the nonplanar surface and the major surface of the stamp at a point of contact is less 25 microns.

Embodiment N. The method of Embodiment M, wherein the interference is less 5 microns.

Embodiment O. The method of Embodiment A, wherein the pattern elements have a stamping surface with a lateral dimension of about 1 micron to about 5 microns.

Embodiment P. The method of Embodiment A, wherein the pattern elements have a stamping surface with a lateral dimension of less than about 1 micron.

Embodiment Q. The method of Embodiment A, wherein the stamping surface comprises pattern elements with a lateral dimension of about 0.25 micron to about 1 micron.

Embodiment R. The method of Embodiment A, wherein the print time sufficient to bind the functional group with the nonplanar surface is less than about 10 seconds.

Embodiment S. The method of Embodiment A, wherein the thickness of the SAM on a surface of the nonplanar surface is less than about 50 Å.

Embodiment T. The method of Embodiment A, wherein the stamping surface comprises a poly(dimethylsiloxane) (PDMS).

Embodiment U. The method of Embodiment A, wherein the functionalizing molecule is an organosulfur compound chosen from alkyl thiols, aryl thiols and combinations thereof.

Embodiment V. The method of Embodiment U, wherein the organosulfur compound is an alkyl thiol.

Embodiment W. The method of Embodiment A, wherein the functional group on the functionalizing molecule comprises a thiol.

Embodiment X. The method of Embodiment A, wherein the nonplanar surface is a metal.

Embodiment Y. The method of Embodiment X, wherein the metal is chosen from gold, silver, platinum, palladium, copper, and alloys and combinations thereof.

Embodiment Z. An apparatus for applying a pattern to a nonplanar surface having a least one portion with a radius of curvature, the apparatus comprising:

a stamper comprising an elastomeric stamp having a first major surface, wherein the first major surface of the stamp has a relief pattern of pattern elements extending away from a base surface, and wherein each pattern element comprises a stamping surface with a lateral dimension of greater than 0 and less than about 5 microns, an ink absorbed into the stamping surfaces of the stamp, the ink comprising a functionalizing molecule with a functional group selected to chemically bind to the nonplanar surface;

a first motion controller supporting the stamper and adapted to move the stamp with respect to the nonplanar surface;

a second motion controller adapted to move the nonplanar surface; and a force controller to control force at an interface between the stamping surfaces on the stamp and the nonplanar surface; wherein the first and the second motion controllers move the stamp and the nonplanar surface in relative motion such that the stamping surfaces contact the nonplanar surface to impart the arrangement of pattern elements thereto, and wherein the relative motion between the stamp and the nonplanar surface is mediated by the force controller to:

(1) control a contact pressure at an interface between the stamping surfaces and the nonplanar surface, and (2) allow the contact force at the interface to vary while the stamping surfaces and the nonplanar surface are in contact with each other.

Embodiment AA. The apparatus of Embodiment Z, wherein the nonplanar surface is the exterior surface of a roller.

Embodiment BB. The apparatus of Embodiment Z, wherein the pattern elements have a stamping surface with a lateral dimension of about 1 micron to about 5 microns.

Embodiment CC. The apparatus of Embodiment Z, wherein the pattern elements have a stamping surface with a lateral dimension of less than about 1 micron.

Embodiment DD. The apparatus of Embodiment Z, wherein the stamping surface comprises pattern elements with a lateral dimension of about 0.25 micron to about 1 micron.

Embodiment EE. The apparatus of Embodiment Z, wherein the stamping surface comprises a poly(dimethylsiloxane) (PDMS).

Embodiment FF. The apparatus of Embodiment Z, wherein the functionalizing molecule is an organosulfur compound chosen from alkyl thiols, aryl thiols and combinations thereof.

Embodiment GG. The apparatus of Embodiment Z, wherein the nonplanar surface is a noble metal chosen from ruthenium, rhodium, palladium, gold, silver, osmium, iridium, platinum, and alloys and combinations thereof.

Embodiment HH. A method of applying a pattern to an exterior surface of a roller, the method comprising:

absorbing an ink into a major surface of a stamp, the ink comprising a functionalizing molecule with a functional group selected to chemically bind to the exterior surface of the roller, wherein the major surface of the stamp comprises a relief pattern of pattern elements extending away from a base surface, and wherein each pattern element comprises a stamping surface with a lateral dimension of greater than 0 and less than about 5 microns;

contacting the stamping surface of the pattern elements with the surface of the roller to bind the functional group with the surface of the roller to form a self-assembled monolayer (SAM) of the functionalizing material on the surface of the roller and impart the arrangement of pattern elements thereto;

translating the major surface of the stamp with respect to the surface of the roller, wherein translating the major surface of the stamp comprises:

(1) controlling a contact pressure at an interface between the patterning surfaces and the surface of the roller, and (2) allowing the contact force at the interface to vary while the patterning surfaces and the surface of the roller are in contact with each other; and repositioning the stamp a plurality of times in a step and repeat fashion to transfer the arrangement of pattern elements to a plurality of different portions of the surface of the roller and form an array of pattern elements, wherein a stitch error between adjacent pattern elements in the array is less than about 10 μm.

Embodiment II. The method of Embodiment HH, wherein the stitch error between adjacent pattern elements in the array is less than about 1 μm.

Embodiment JJ. The method of Embodiment HH, wherein the stamp is a parallelepiped comprising a parallelogrammatic cross-section, and the pattern elements in the array comprise parallelogrammatic tiles.

Embodiment KK. The method of Embodiment JJ, wherein the pattern elements are helically arranged on the surface of the roller.

Embodiment LL. A method of making a tool, the method comprising:

providing a cylindrical roller comprising a metal substrate, a tooling layer on the metal substrate, and an external metal print layer on the tooling layer;

imparting an arrangement of pattern elements on the metal print layer, wherein each pattern element comprises a lateral dimension of greater than 0 and less than about 5 microns; and translating the major surface of the stamp with respect to the metal print layer, wherein translating the major surface of the stamp comprises:

(1) controlling a contact pressure at an interface between the patterning surfaces and the print layer, and (2) allowing the contact force at the interface to vary while the patterning surfaces and the print layer are in contact with each other; and imparting the pattern elements a plurality of times in a step and repeat fashion to transfer the arrangement of pattern elements to a plurality of different portions of the print layer and form an array of pattern elements thereon, wherein a stitch error between adjacent pattern elements in the array is less than about 10 μm; and etching away portions of the metal print layer uncovered by the pattern elements, exposing portions of the tooling layer.

Embodiment MM. The method of Embodiment LL, wherein the stitch error between adjacent pattern elements in the array is less than about 1 μm.

Embodiment NN. The method of Embodiment LL, further comprising reactive ion etching to remove portions of the tooling layer uncovered by the pattern elements, and expose portions of the metal substrate.

Embodiment OO. The method of Embodiment NN, further comprising stripping away the pattern elements and the metal print layer to expose portions of the tooling layer thereunder.

Embodiment PP. The method of Embodiment LL, wherein the metal substrate comprises copper.

Embodiment QQ. The method of Embodiment LL, wherein the tooling layer comprises a material chosen from diamond-like carbon (DLC), diamond-like glass (DLG), tungsten, and combinations thereof.

Embodiment RR. The method of Embodiment LL, wherein the metal print layer comprises a noble metal chosen from silver and gold.

Embodiment SS. The method of Embodiment LL, wherein the pattern elements are imparted to the print layer by a method chosen from printing, nanoimprint lithography, electrochemical etching, embossing, and combinations thereof.

Embodiment TT. The method of Embodiment LL, wherein the pattern elements are imparted by microcontact printing.

Various embodiments of the invention have been described. These and other embodiments are within the scope of the following claims.

The invention claimed is:

1. A method of applying a pattern to a nonplanar surface, wherein at least a portion of the nonplanar surface has a radius of curvature, the method comprising:

providing a stamp with a major surface comprising a relief pattern of pattern elements extending away from a base surface, and wherein each pattern element comprises a stamping surface with a lateral dimension of greater than 0 and less than about 5 microns;

applying an ink on the stamping surface, the ink comprising a functionalizing molecule with a functional group selected to chemically bind to the nonplanar surface;

positioning the stamp to initiate rolling contact between the nonplanar surface and the major surface of the stamp;

contacting the stamping surface of the pattern elements with the nonplanar surface to form a self-assembled monolayer (SAM) of the functionalizing material on the nonplanar surface and impart the arrangement of pattern elements thereto; and translating the major surface of the stamp with respect to the nonplanar surface, wherein translating the major surface of the stamp comprises:

(1) controlling a contact pressure at an interface between the stamping surfaces and the nonplanar surface, by (2) varying a contact force at the interface based on contact area at known positions on the stamping surface while the stamping surfaces and the nonplanar surface are in contact with each other.

2. The method of claim 1, wherein the pressure is controlled to maintain a substantially constant contact pressure at the interface.

3. The method of claim 1, wherein the contact area at known positions on the stamping surface is obtained experimentally.

4. The method of claim 1, wherein the contact area at known positions on the stamping surface is obtained from modeling.

5. The method of claim 1, further comprising repositioning the stamp to apply the arrangement of pattern elements to a plurality of different portions of the nonplanar surface in a step and repeat fashion.

6. The method of claim 1, wherein the stamping surface comprises a poly(dimethylsiloxane) (PDMS), and wherein the functionalizing molecule is an organosulfur compound chosen from alkyl thiols, aryl thiols and combinations thereof.

7. The method of claim 1, wherein the nonplanar surface is a metal chosen from gold, silver, platinum, palladium, or copper, or alloys and combinations thereof.

8. An apparatus for applying a pattern to a nonplanar surface having a least one portion with a radius of curvature, the apparatus comprising:
- a stamper comprising an elastomeric stamp having a first major surface, wherein the first major surface of the stamp has a relief pattern of pattern elements extending away from a base surface, and wherein each pattern element comprises a stamping surface with a lateral dimension of greater than 0 and less than about 5 microns,
- an ink absorbed into the stamping surfaces of the stamp, the ink comprising a functionalizing molecule with a functional group selected to chemically bind to the nonplanar surface;
- a first motion controller supporting the stamper and adapted to move the stamp with respect to the nonplanar surface;
- a second motion controller adapted to move the nonplanar surface; and
- a force controller to control force at an interface between the stamping surfaces on the stamp and the nonplanar surface; wherein
- the first and the second motion controllers are adapted to move the stamp and the nonplanar surface in relative motion such that the stamping surfaces contact the nonplanar surface to impart the arrangement of pattern elements thereto, and
- wherein the force controller is adapted to mediate the relative motion between the stamp and the nonplanar surface to:
  (1) control a contact pressure at an interface between the stamping surfaces and the nonplanar surface, by
  (2) varying a contact force at the interface based on contact area at known positions on the stamping surface while the stamping surfaces and the nonplanar surface are in contact with each other.

9. The apparatus of claim 8, wherein the nonplanar surface is the exterior surface of a roller.

10. A method of applying a pattern to an exterior surface of a roller, the method comprising:
- absorbing an ink into a major surface of a stamp, the ink comprising a functionalizing molecule with a functional group selected to chemically bind to the exterior surface of the roller, wherein the major surface of the stamp comprises a relief pattern of pattern elements extending away from a base surface, and wherein each pattern element comprises a stamping surface with a lateral dimension of greater than 0 and less than about 5 microns;
- contacting the stamping surface of the pattern elements with the surface of the roller to bind the functional group with the surface of the roller to form a self-assembled monolayer (SAM) of the functionalizing material on the surface of the roller and impart the arrangement of pattern elements thereto;
- translating the major surface of the stamp with respect to the surface of the roller, wherein translating the major surface of the stamp comprises:
  (1) controlling a contact pressure at an interface between the stamping surfaces and the surface of the roller, by
  (2) varying a contact force at the interface based on contact area at known positions on the stamping surface while the stamping surfaces and the surface of the roller are in contact with each other; and
- repositioning the stamp a plurality of times in a step and repeat fashion to transfer the arrangement of pattern elements to a plurality of different portions of the surface of the roller and form an array of pattern elements, wherein a stitch error between adjacent pattern elements in the array is less than about 10 μm.

11. The method of claim 10, wherein the stitch error between adjacent pattern elements in the array is less than about 1 μm.

12. The method of claim 10, wherein the stamp is a parallelepiped comprising a parallelogrammatic cross-section, and the pattern elements in the array comprise parallelogrammatic tiles.

13. The method of claim 10, wherein the pattern elements are helically arranged on the surface of the roller.

14. The method of claim 10, wherein the roller is a cylindrical roller comprising a metal substrate, a tooling layer on the metal substrate, and an external metal print layer on the tooling layer, wherein the exterior surface of the roller comprises the external metal print layer, the method further comprising
- etching away portions of the external metal print layer uncovered by the pattern elements, exposing portions of the tooling layer.

* * * * *

UNITED STATES PATENT AND TRADEMARK OFFICE
CERTIFICATE OF CORRECTION

PATENT NO. : 11,446,918 B2
APPLICATION NO. : 15/733300
DATED : September 20, 2022
INVENTOR(S) : James Zhu et al.

It is certified that error appears in the above-identified patent and that said Letters Patent is hereby corrected as shown below:

In the Claims

Column 21
Line 10, In Claim 8, delete "a least" and insert -- at least --, therefor.

Signed and Sealed this
Eighteenth Day of July, 2023

Katherine Kelly Vidal
*Director of the United States Patent and Trademark Office*